(12) United States Patent
Park et al.

(10) Patent No.: US 11,723,148 B2
(45) Date of Patent: Aug. 8, 2023

(54) DISPLAY APPARATUS

(71) Applicant: SAMSUNG DISPLAY CO., LTD., Yongin-si (KR)

(72) Inventors: Jeongeun Park, Goyang-si (KR); Hanho Park, Yongin-si (KR); Jeongmin Ban, Cheonan-si (KR); Joongmok Lee, Suwon-si (KR); Chung-Seok Lee, Hwaseong-si (KR); Soyeon Joo, Yongin-si (KR); Seoungbum Pyoun, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 31 days.

(21) Appl. No.: 17/464,647

(22) Filed: Sep. 1, 2021

(65) Prior Publication Data
US 2022/0174817 A1    Jun. 2, 2022

(30) Foreign Application Priority Data

Dec. 1, 2020    (KR) ........................ 10-2020-0165488

(51) Int. Cl.
| | | |
|---|---|---|
| H05K 1/11 | (2006.01) | |
| H05K 1/14 | (2006.01) | |
| H05K 1/18 | (2006.01) | |
| H01L 25/18 | (2023.01) | |
| G02F 1/1345 | (2006.01) | |

(52) U.S. Cl.
CPC ............. *H05K 1/117* (2013.01); *H01L 25/18* (2013.01); *H05K 1/118* (2013.01); *H05K 1/147* (2013.01); *H05K 1/189* (2013.01); *G02F 1/13452* (2013.01); *H05K 2201/094* (2013.01); *H05K 2201/10128* (2013.01); *H05K 2201/10136* (2013.01)

(58) Field of Classification Search
CPC ........ H05K 1/117; H05K 1/118; H05K 1/147; H05K 1/189; H05K 2201/094; H05K 2201/10128; H05K 2201/10136; H01L 25/18; G02F 1/13452
USPC ........................................................ 361/749
See application file for complete search history.

(56) References Cited

U.S. PATENT DOCUMENTS

| | | |
|---|---|---|
| 9,883,562 B2 | 2/2018 | Jo et al. |
| 10,651,260 B2 | 5/2020 | Lee et al. |

(Continued)

FOREIGN PATENT DOCUMENTS

| | | |
|---|---|---|
| JP | 3100743 | 10/2000 |
| KR | 20000073836 | 12/2000 |

(Continued)

*Primary Examiner* — Andargie M Aychillhum
(74) *Attorney, Agent, or Firm* — F. Chau & Associates, LLC

(57) ABSTRACT

Provided is a display apparatus. The display apparatus includes a flexible circuit board including flexible pads, a main circuit board including main pads, and a display panel including a plurality of pixels connected to the flexible circuit board and configured to receive a signal from the driving chip. In each of the flexible pads and the main pads, a portion of the pads is gradually tilted from pads disposed at a center to pads disposed at an outer side among the pads, and a tilted angle of a main pad disposed at the outermost side of the main circuit board is greater than that of a flexible pad disposed at the outermost side of the flexible circuit board.

20 Claims, 14 Drawing Sheets

(56) References Cited

U.S. PATENT DOCUMENTS

2015/0109544 A1* 4/2015 Yeo .................. H10K 59/00
                                                    349/12
2020/0015356 A1* 1/2020 Park .................. H05K 1/189

FOREIGN PATENT DOCUMENTS

| KR | 101551532   | 9/2015 |
| KR | 20160090980 | 8/2016 |
| KR | 20190021525 | 3/2019 |

* cited by examiner

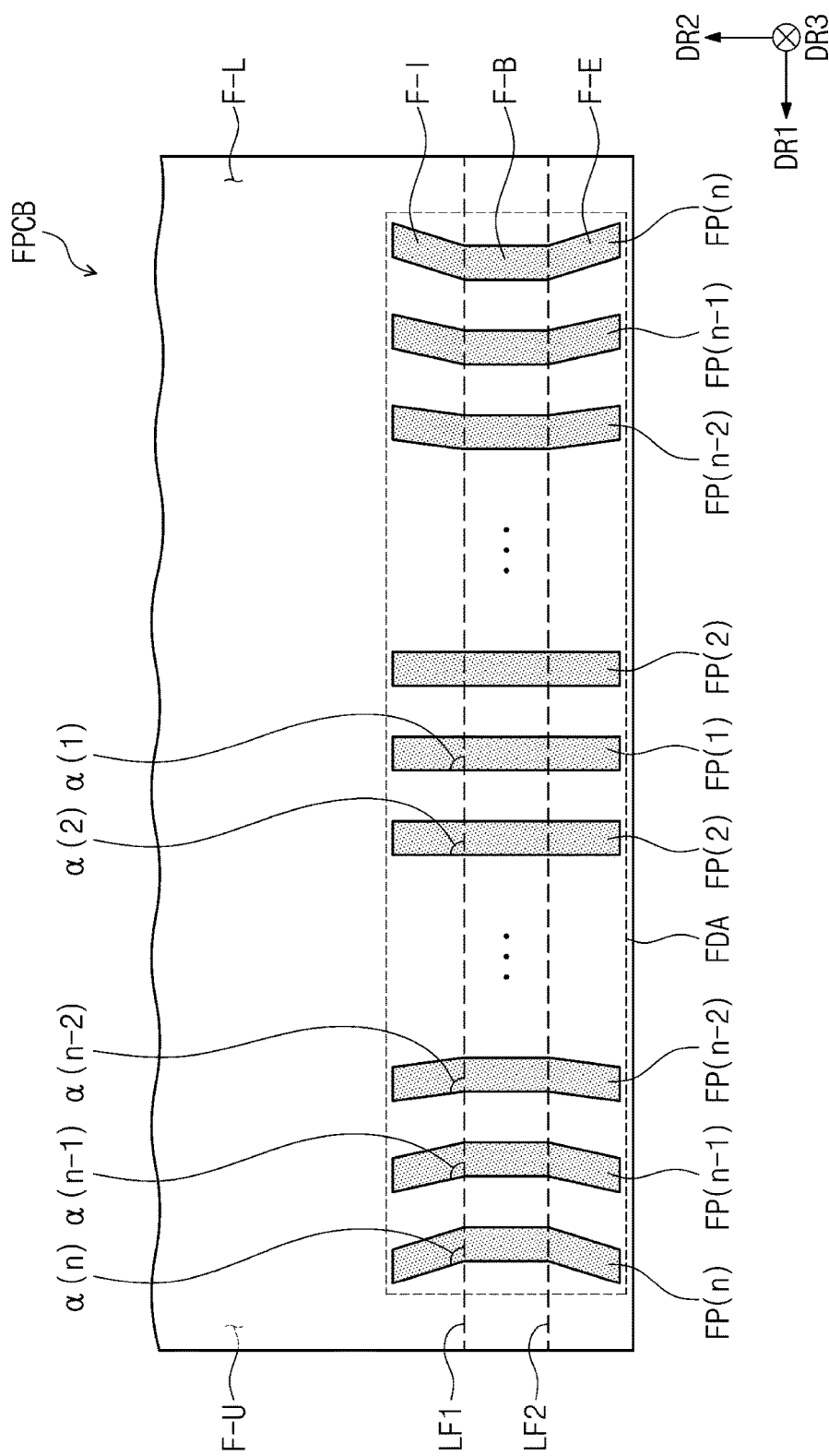

DISPLAY APPARATUS

CROSS-REFERENCE TO RELATED APPLICATION

This U.S. non-provisional patent application claims priority under 35 U.S.C. § 119 to Korean Patent Application No. 10-2020-0165488, filed on Dec. 1, 2020, the disclosure of which is incorporated by reference herein in its entirety.

TECHNICAL FIELD

The present disclosure herein relates to a display apparatus, and more particularly, to a display apparatus having a compensating pad structure and increased reliability.

DISCUSSION OF THE RELATED ART

Display devices are used to provide information to a user by displaying images, video, user interfaces, and the like. A display device may include processors, memory, and a display apparatus.

A display apparatus connects a circuit board to a display panel after the display panel is manufactured. For example, in a tape automated bonding (TAB) mounting method, the flexible circuit board is bonded to the display panel by using an anisotropic conductive film (ACF).

In some conventional display devices, however, fabrication and process errors may cause a misalignment between connecting pads during pressure bonding. Accordingly, there has been research into solutions to increase the reliability of these display devices.

SUMMARY

The present disclosure provides a display apparatus that prevents contact failure between pads from occurring in the process of bonding a circuit board.

An embodiment of the inventive concept provides a display apparatus including: a flexible circuit board on which includes a driving chip, and further includes flexible pads arranged in a first direction and extending in a second direction crossing the first direction; a main circuit board including main pads, and that partially overlaps with the flexible circuit board such that corresponding flexible pads overlap with the main pads in a third direction that is perpendicular to the first direction and the second direction; and a display panel including a plurality of pixels connected to the flexible circuit board and configured to receive a signal from the driving chip, wherein, in each of the flexible pads and the main pads, a portion of the pads is gradually tilted from pads disposed at a center to pads disposed at an outer side among the pads, and a tilted angle of a main pad disposed at the outermost side of the main circuit board is greater than a tilted angle of a flexible pad disposed at the outermost side of the flexible circuit board.

In an embodiment, each of the flexible pads may include a first central portion and a first outer tilted portion and a first inner tilted portion, which are tilted at the same angle from the first central portion, and each of the main pads may include a second central portion overlapping the first central portion and a second outer tilted portion, which overlaps the first inner tilted portion of a corresponding flexible pad, and a second inner tilted portion, which overlaps the first outer tilted portion of a corresponding flexible pad, wherein the second outer tilted portion and the second inner tilted portion are tilted at the same angle.

In an embodiment, a tilted angle of each of the flexible pads may be defined as an angle at which each of the first outer tilted portion and the first inner tilted portion is tilted from the first central portion, and a tilted angle of each of the main pads may be defined as an angle at which each of the second outer tilted portion and the second inner tilted portion is tilted from the second central portion.

In an embodiment, the second inner tilted portion of each of the main pads may protrude from the first outer tilted portion of a corresponding flexible pad that is in contact with the second inner tilted portion, and the protruding part of the second inner tilted portion may be exposed to the outside of the flexible circuit board.

In an embodiment, a length of the second inner tilted portion that protrudes in the second direction may be less than half of a length of the second central portion in the second direction.

In an embodiment, each of the first outer tilted portion and the first inner tilted portion may be tilted from the first central portion in an outward direction toward the outside of the flexible circuit board, and each of the second outer tilted portion and the second inner tilted portion may be tilted from the second central portion in an outward direction toward the outside of the main circuit board.

In an embodiment, each of the first outer tilted portion and the first inner tilted portion may be tilted from the first central portion in an inward direction toward a center of the flexible circuit board, and each of the second outer tilted portion and the second inner tilted portion may be tilted from the second central portion in an inward direction toward a center of the main circuit board.

In an embodiment, each main pad of the main pads may have an area greater than an area of a corresponding flexible pad that it's connected to.

In an embodiment, the first central portion and the second central portion may have the same length.

In an embodiment, the flexible circuit board may be provided in plural, and the plurality of flexible circuit boards may be arranged along the first direction on the display panel.

In an embodiment of the inventive concept, a display apparatus includes: a flexible circuit board which includes a driving chip, and which further includes flexible pads arranged in a first direction and extending in a second direction crossing the first direction; a main circuit board including main pads and partially overlaps the flexible circuit board such that the main pads are connected to corresponding flexible pads and overlap the flexible pads in a third direction that is perpendicular to the first direction and the second direction; and a display panel including a plurality of pixels connected to the flexible circuit board and configured to receive a signal from the driving chip, wherein each of the flexible pads includes a first central portion and a first tilted portion that is tilted from the first central portion, and an angle at which the first tilted portion is tilted from the first central portion and is defined as a first angle, and wherein each of the main pads includes a second central portion overlapping the first central portion of a corresponding flexible pad, and further includes a second tilted portion overlapping the first tilted portion of a corresponding flexible pad, and an angle at which the second tilted portion is tilted from the second central portion and is defined as a second angle, and a difference between the first angle and the second angle of the overlapping pads among the flexible pads and the main pads gradually increases from pads disposed at a center to pads disposed at an outer side among the flexible pads.

In an embodiment, the first tilted portion may include a first outer tilted portion and a first inner tilted portion, which are spaced apart from each other in the second direction with the first central portion therebetween and are tilted from the first central portion at the same angle, and the second tilted portion may include a second outer tilted portion and a second inner tilted portion, which are spaced apart from each other in the second direction with the second central portion therebetween and are tilted from the second central portion at the same angle, wherein the second outer tilted portion overlaps the first inner tilted portion, and the second inner tilted portion overlaps the first outer tilted portion.

In an embodiment, the second inner tilted portion of each of the main pads may protrude from the first outer tilted portion of a corresponding flexible pad that is in contact with the second inner tilted portion, and the protruding portion of the second inner tilted portion is exposed to the outside of the flexible circuit board.

In an embodiment, a length of the second inner tilted portion that protrudes in the second direction may be less than half of a length of the second central portion in the second direction.

In an embodiment, a length of the first inner tilted portion in the second direction and a length of the second outer tilted portion in the second direction may be the same.

In an embodiment, the first central portion and the second central portion may have the same length.

In an embodiment, the first tilted portion may be tilted from the first central portion in an outward direction toward the outside of the flexible circuit board, and the second tilted portion may be tilted from the second central portion in an outward direction toward the outside of the main circuit board.

In an embodiment, the first tilted portion may be tilted from the first central portion in an inward direction toward the inside of the flexible circuit board, and the second tilted portion may be tilted from the second central portion in an inward direction toward the inside of the main circuit board.

In an embodiment, each main pad of the main pads may have an area greater than an area of a corresponding flexible pad that it connects to.

In an embodiment, the flexible circuit board may be provided in plural, and the plurality of flexible circuit boards may be arranged along the first direction on the display panel.

BRIEF DESCRIPTION OF THE DRAWINGS

The above and other aspects and features of the present disclosure will become more apparent by describing in detail embodiments thereof with reference to the attached drawings, in which:

FIG. 4 is an enlarged view illustrating one area of a flexible circuit board according to an embodiment of the inventive concept;

DETAILED DESCRIPTION OF THE EMBODIMENTS

Figure 1:
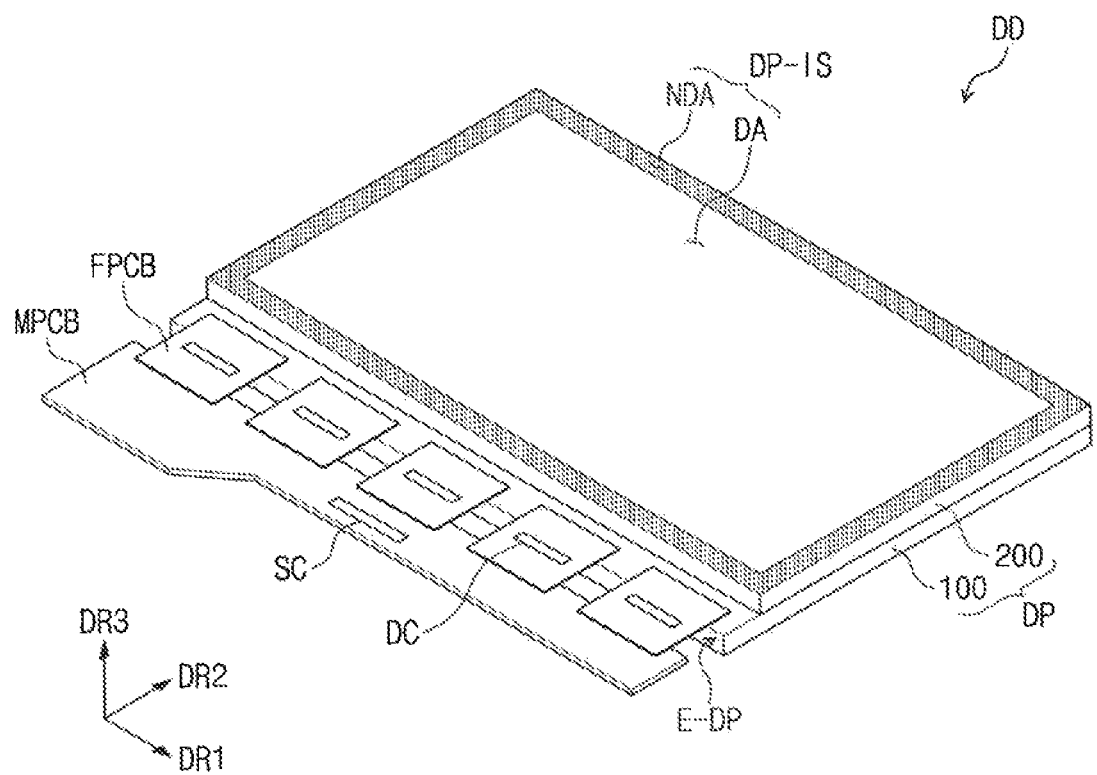
FIG. 1 is a perspective view of a display apparatus according to an embodiment of the inventive concept.

The present disclosure may be variously modified and realized in many different forms, and thus specific embodiments will be illustrated in the drawings and described in detail hereinbelow. However, the present disclosure should not necessarily be limited to the specific disclosed forms, and should be construed to include all modifications, equivalents, or replacements included in the spirit and scope of the present disclosure.

In this specification, it will also be understood that when one component (or area, layer, portion, etc.) is referred to as being 'on', 'connected to', or 'coupled to' another component, it can be directly disposed/connected/coupled on/to the one component, or an intervening third component may also be present.

Like reference numerals refer to like elements throughout, and to the extent that a description of an element has been omitted, it may be understood that the element is at least similar to corresponding elements that are described elsewhere in the specification. Also, in the figures, the thickness, ratio, and dimensions of components may be exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The description of an element applied to its singular form may also to apply to a plurality of the same elements unless otherwise indicated by context.

Also, "under", "below", "above", "upper", and the like are used for explaining relation association of components illustrated in the drawings. The terms may be a relative concept and described based on directions expressed in the drawings. However, when one component is described as "overlapping" another component, this generally describes a relationship where the two components overlap each other in a thickness (e.g., a vertical or third) direction, unless otherwise specified or indicated by the figures or context.

Unless otherwise defined, all terms (including technical and scientific terms) used herein have the same meaning as commonly understood by a person of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The meaning of 'include' or 'comprise' specifies a property, a fixed number, a step, an operation, an element, a component or a combination thereof, but does not exclude other properties, fixed numbers, steps, operations, elements, components or combinations thereof. Hereinafter, embodiments of the inventive concept will be described with reference to the accompanying drawings.

Figure 2A:
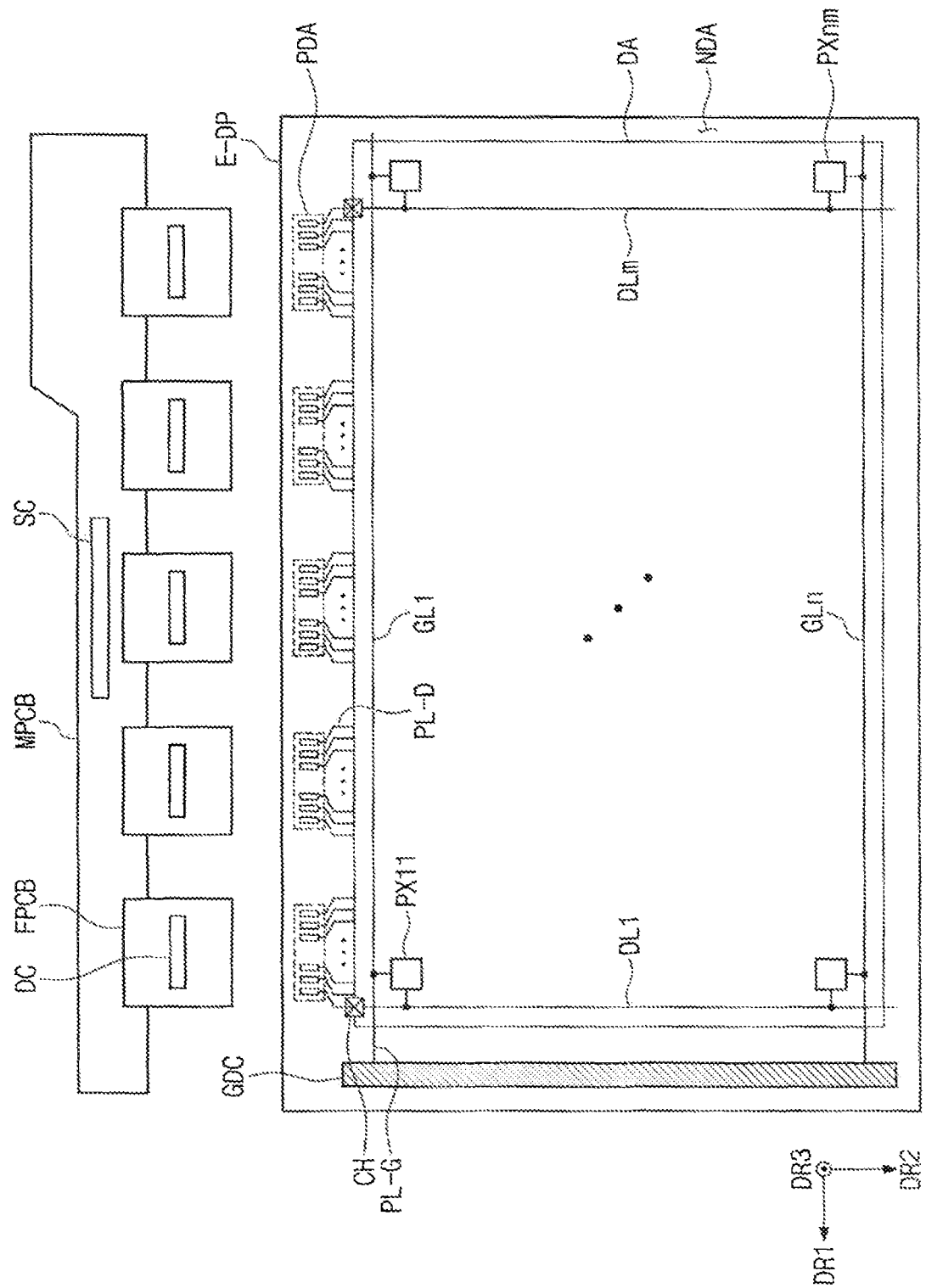
FIG. 2A is a plan view of the display apparatus according to an embodiment of the inventive concept.
Figure 2B:
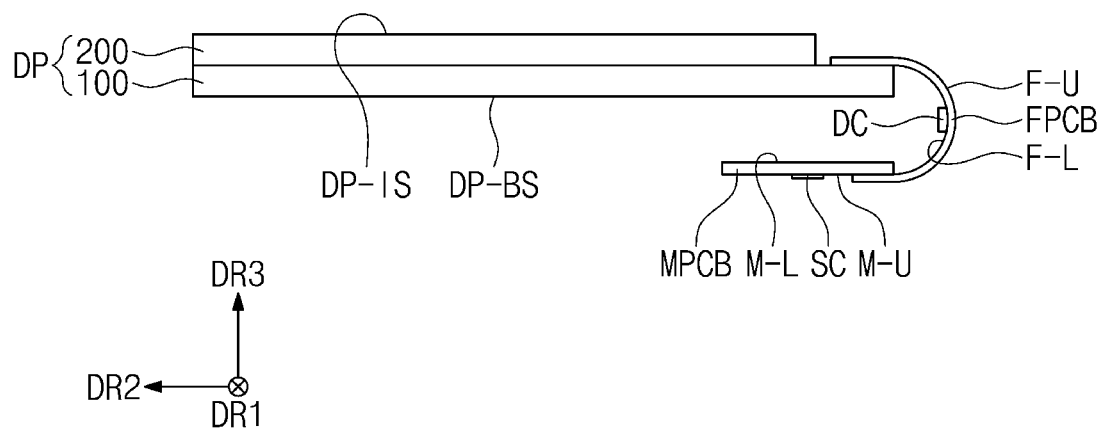
FIG. 2B is a cross-sectional view of the display apparatus according to an embodiment of the inventive concept.
Figure 3A:
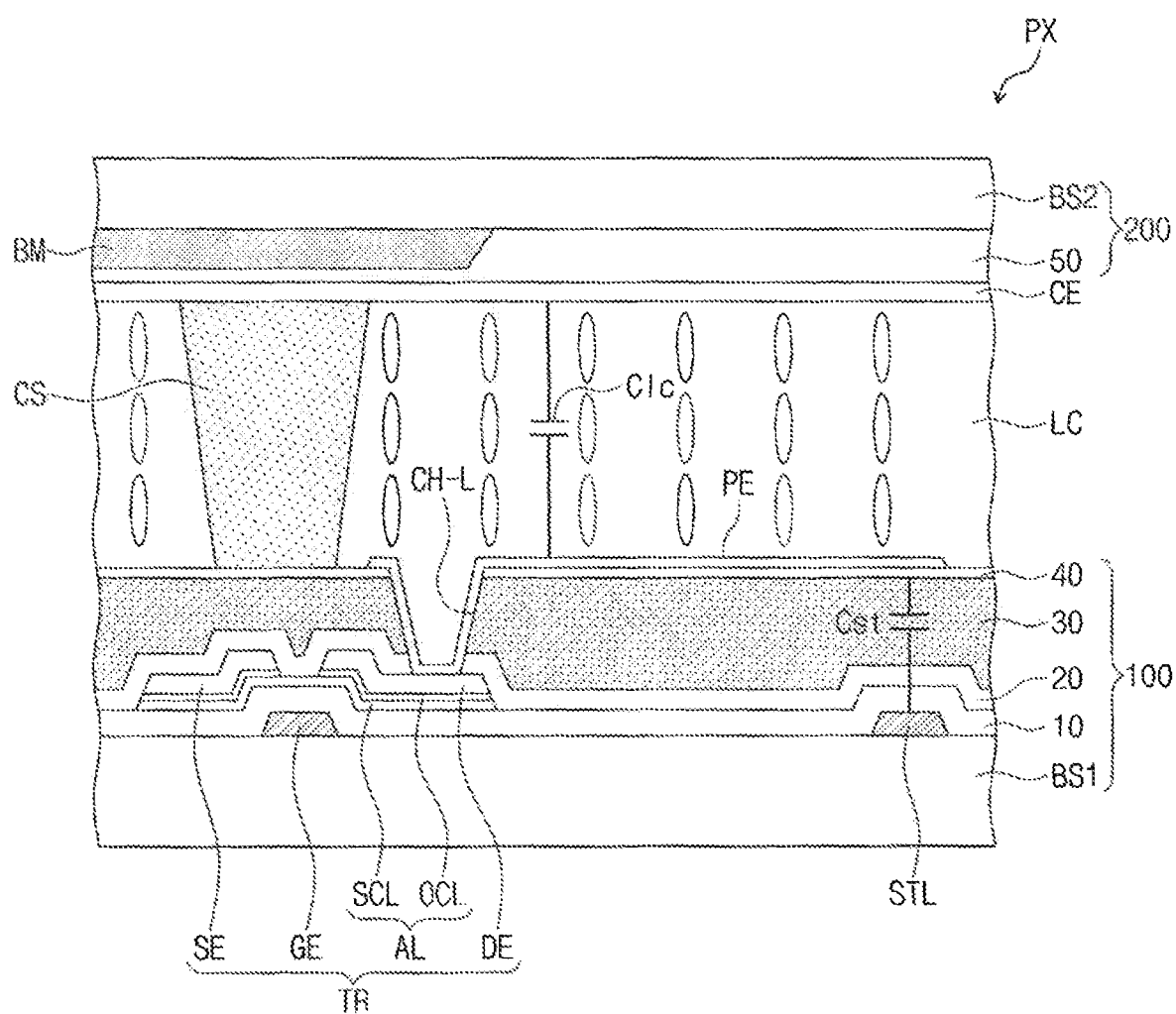
FIG. 3A is a cross-sectional view illustrating a display area of a display panel according to an embodiment of the inventive concept.
Figure 3B:
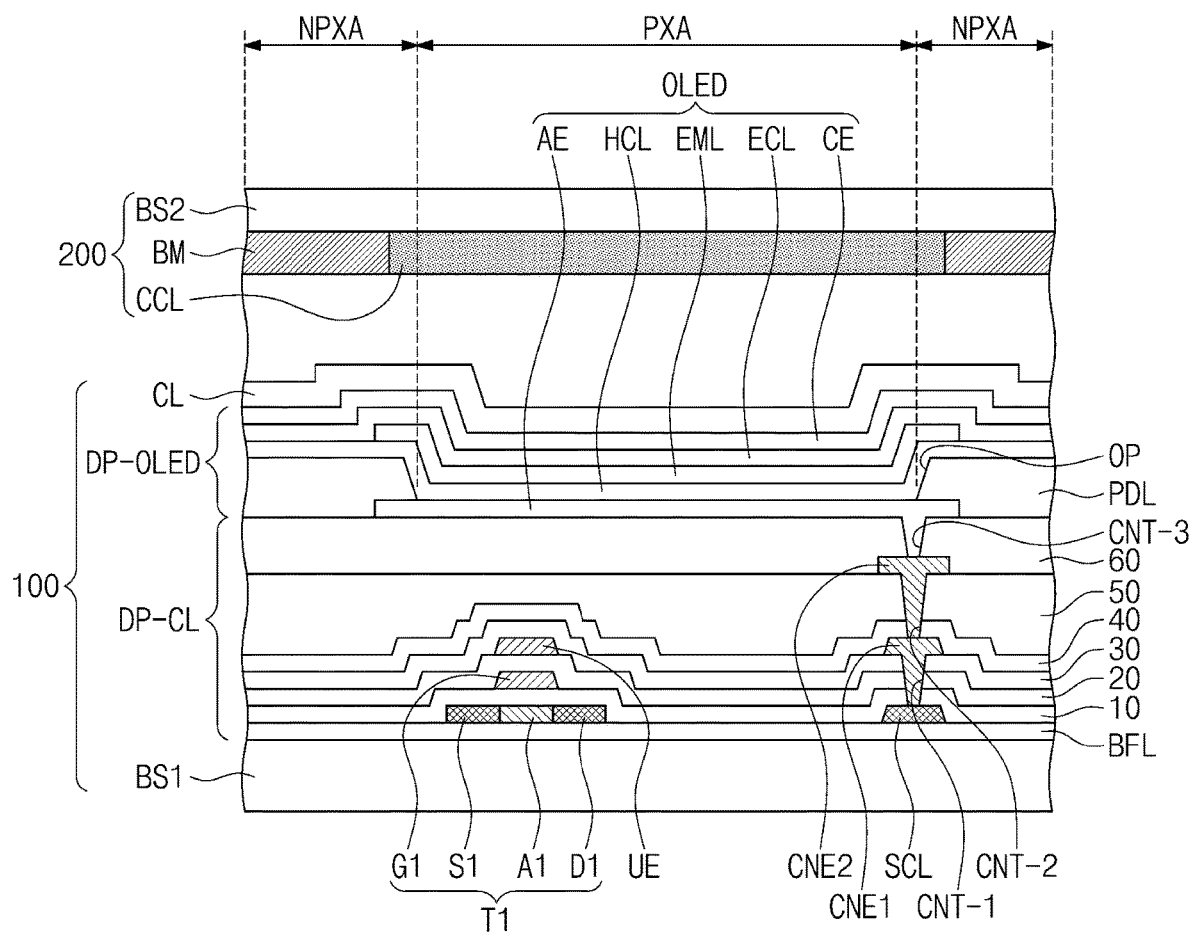
FIG. 3B is a cross-sectional view illustrating a display area of a display panel according to an embodiment of the inventive concept.

FIG. 1 is a perspective view of a display apparatus according to an embodiment of the inventive concept. FIG. 2A is a plan view of the display apparatus according to an embodiment of the inventive concept. FIG. 2B is a cross-sectional view of the display apparatus according to an embodiment of the inventive concept. FIG. 3A is a cross-sectional view illustrating a display area of a display panel according to an embodiment of the inventive concept. FIG. 3B is a cross-sectional view illustrating a display area of a display panel according to an embodiment of the inventive concept.

Referring to FIGS. 1 to 2B, a display apparatus DD may include a display panel DP, a flexible circuit board FPCB, and a main circuit board MPCB.

In this embodiment, the display panel DP may be a liquid crystal display panel, a plasma display panel, an electrophoretic display panel, a microelectromechanical system (MEMS) display panel, an electrowetting display panel, an organic light emitting display panel, or a quantum-dot display panel. When the display panel DP is the liquid crystal display panel, the display apparatus DD may further include a backlight unit disposed under the display panel DP.

The display panel DP may include a first display substrate 100 and a second display substrate 200. The second display substrate 200 may face the first display substrate 100. A gradation display layer for generating an image may be disposed between the first display substrate 100 and the second display substrate 200. The gradation display layer may include a liquid crystal layer, an organic emission layer, and/or an electrophoretic layer according to different types of the display panels.

The display apparatus DD may further include a window covering the display panel DP and a chassis member or molding member that is coupled to the window to define an outer appearance of the display apparatus DD.

As illustrated in FIG. 1, the display panel DP may display an image through a display surface DP-IS. The display surface DP-IS is parallel to a surface defined by a first direction DR1 and a second direction DR2. The display surface DP-IS may include a display area DA and a non-display area NDA.

The non-display area NDA may be defined along a lateral edge of the display surface DP-IS. The display area DA may be surrounded by the non-display area NDA. However, the embodiment of the inventive concept is not necessarily limited thereto. For example, the non-display area NDA may be disposed at only one area adjacent to the flexible circuit board FPCB.

A normal direction of the display surface DP-IS, e.g., a thickness direction of the display panel DP may be a third direction DR3. A front surface (or top surface or upper portion) and a rear surface (or bottom surface or lower portion) of some elements and/or layers that will be described below may be distinguished by the third direction DR3. However, the first to third directions illustrated in this embodiment may be merely examples.

Although the display panel DP having a planar display surface DP-IS is illustrated in an embodiment of the inventive concept, the display surface is not necessarily limited thereto. The display apparatus DD may include a curved display surface or a solid display surface. The solid display surface may include a plurality of display areas that display in different directions.

The main circuit board MPCB may be spaced apart from an edge E-DP of the display panel DP. A signal controller SC may be mounted on the main circuit board MPCB. The signal controller SC is configured to receive image data and a control signal from an external graphic controller. The signal controller SC may provide the control signal to the display panel DP.

The flexible circuit board FPCB electrically connects the display panel DP to the main circuit board MPCB. The flexible circuit board FPCB may include flexible pads that are connected one-to-one to correspond to the display pads disposed on the display pad area PDA of the display panel DP. Also, the flexible circuit board FPCB may include flexible pads FP(1) to FP(n) (see FIG. 4) connected one-to-one to correspond to main pads MP(1) to MP(m) (see FIG. 5) disposed on a main pad area MDA (see FIG. 5) of the main circuit board MPCB.

A conductive adhesive member may connect the flexible pads FP(1) to FP(n) (see FIG. 4) to the main pads MP(1) to MP(m) (see FIG. 4). The conductive adhesive member may include an anisotropic conductive film (ACF). Hereinafter, the anisotropic conductive film (ACF) will be referred to as the conductive adhesion member. A predetermined heat and pressure may be applied to the flexible circuit board FPCB through a pressing bar to connect the pads to each other.

In some cases, while pressing the pressing bar, the flexible circuit board FPCB and the display panel DP or the main circuit board MPCB and the display panel DP may be tilted, and cause misalignment between the pads.

The flexible circuit board FPCB may include a driving chip DC. The driving chip DC may receive a signal from the main circuit board MPCB, and the display panel DP may receive the signal from the driving chip DC. For example, the driving chip DC may be a data driver circuit. In an embodiment of the inventive concept, the flexible circuit board FPCB may transmit the signal provided from the signal controller SC to the display panel DP.

In this embodiment, a plurality of flexible circuit boards FPCBs may be provided. For example, the flexible circuit boards may be spaced apart from each other in the first direction DR1. However, the embodiment of the inventive concept is not necessarily limited thereto. For example, the flexible circuit boards FPCB may include two types of flexible circuit boards at least partially overlapping each other.

In this embodiment, the display pad area PDA is disposed on the first display substrate 100, but the embodiment of the inventive concept is not necessarily limited thereto. In an embodiment of the inventive concept, the display pad area PDA may be disposed on the second display substrate 200.

FIG. 2A illustrates an arrangement relationship between signal lines GL1 to GLn, DL1 to DLm, PL-G, and PL-D and pixels PX11 to PXnm. The signal lines GL1 to GLn, DL1 to DLm, PL-G, and PL-D may include a plurality of gate lines GL1 to GLn, a plurality of data lines DL1 to DLm, and auxiliary signal lines PL-G and PL-D.

The plurality of gate lines GL1 to GLn extend in the first direction DR1 and are arranged in the second direction DR2. The plurality of data lines DL1 to DLm may cross the plurality of gate lines GL1 to GLn, and may be insulated from the plurality of gate lines GL1 to GLn. The gate lines GL1 to GLn and the data lines DL1 to DLm may overlap the display area DA. The auxiliary signal lines PL-G and PL-D may overlap the non-display area NDA, and the auxiliary signal lines PL-G and PL-D are connected to the corresponding gate lines GL1 to GLn and the corresponding data lines DL1 to DLm.

The second auxiliary signal lines PL-D connected to the data lines DL1 to DLm may be disposed on a layer different from the layer on which the plurality of data lines DL1 to DLm are disposed. The data lines DL1 to DLm may be electrically connected to corresponding second auxiliary signal lines PL-D of the second auxiliary signal lines PL-D through contact holes CH. The contact holes CH may penetrate at least one insulation layer disposed between the data lines DL1 to DLm and the second auxiliary signal lines PL-D. In FIG. 2A, two contact holes CH are illustrated as an example.

In an embodiment of the inventive concept, the contact hole CH may be omitted. The data lines DL1 to DLm and the second auxiliary signal lines PL-D may be disposed on the same layer. For example, the data line and the second auxiliary signal line, which are connected to each other, among the data lines DL1 to DLm and the second auxiliary signal lines PL-D may be defined as one signal line. The data line and the second auxiliary signal line, which are connected to each other, may be defined as different portions of one signal line.

The pixels PX11 to PXnm may be disposed on the display area DA. The pixels PX11 to PXnm may not be disposed on the non-display area NDA. Each pixel of the pixels PX11 to PXnm may be connected to a corresponding gate line of the plurality of gate lines GL1 to GLn and a corresponding data line of the plurality of data lines DL1 to DLm. Each of the pixels PX11 to PXnm may include a pixel driver circuit and a display element.

In FIG. 2A, although the pixels PX11 to PXnm are arranged in a rectangular matrix as an example, the embodiment of the inventive concept is not necessarily limited thereto. For example, the pixels PX11 to PXnm may be arranged in a diamond shape. In this case, an arrangement structure of the pixels PX11 to PXnm may be defined as a pen-tile structure.

The gate driver circuit GDC may be integrated with the display panel DP through an oxide silicon gate driver circuit (OSG) process or an amorphous silicon gate driver circuit (ASG) process. The first auxiliary signal lines PL-G may receive a gate signal from the gate driver circuit GDC.

Referring to FIG. 2B, the flexible circuit board FPCB may be bent at a predetermined curvature in a direction towards the rear surface DP-BS of the display panel DP. In this case, the main circuit board MPCB may be disposed on or near the rear surface DP-BS of the display panel DP. In this embodiment, the flexible circuit board FPCB may include a front surface F-U and a rear surface F-L. The driving chip DC may be mounted on the rear surface F-L of the flexible circuit board FPCB. The main circuit board MPCB may include a front surface M-U and a rear surface M-L. When the flexible circuit board FPCB is bent toward the rear surface DP-BS of the display panel DP, the rear surface M-L of the main circuit board MPCB may face the rear surface DP-BS of the display panel DP.

FIGS. 3A and 3B are cross-sectional views illustrating the display area DA of the display panel DP according to an embodiment of the inventive concept. FIG. 3A illustrates a cross-section corresponding to the pixel PX of a liquid crystal display panel, and FIG. 3B illustrates a cross-section corresponding to the pixel PX of an organic light emitting display panel.

Referring to FIG. 3A, the gradation display layer of the display panel DP (see in FIG. 1) according to an embodiment of the inventive concept may include a liquid crystal layer. For example, the display panel DP may be a liquid crystal display panel. When the display panel DP is the liquid crystal display panel, the display apparatus DD (see in FIG. 1) may further include a backlight unit disposed under the display panel DP.

The pixel PX of the liquid crystal display panel may include a transistor TR, a liquid crystal capacitor Clc, and a storage capacitor Cst.

The transistor TR includes a control electrode GE connected to the gate line, an activation part AL overlapping the control electrode GE in a thickness direction, an input electrode SE connected to the data line, and an output electrode DE spaced apart from the input electrode SE. The liquid crystal capacitor Clc includes a pixel electrode PE and a common electrode CE. The storage capacitor Cst includes the pixel electrode PE and a portion of a storage line STL overlapping the pixel electrode PE.

The control electrode GE and the storage line STL are disposed on one surface of a first base substrate BS1. The first base substrate BS1 may include a glass substrate, a plastic substrate, and/or a substrate including polyimide (PI). A first insulation layer 10 covering the control electrode GE and the storage line STL is disposed on one surface of the first base substrate BS1. The first insulation layer 10 may include an inorganic material and/or an organic material.

The activation part AL overlapping the control electrode GE is disposed on the first insulation layer 10. The activation part AL may include a semiconductor layer SCL and an ohmic contact layer OCL. The semiconductor layer SCL is disposed on the first insulation layer 10, and the ohmic contact layer OCL is disposed on the semiconductor layer SCL.

The semiconductor layer SCL may include an amorphous silicon or a polysilicon. The semiconductor layer SCL may also include a metal oxide semiconductor. The ohmic contact layer OCL may include a dopant doped at a density higher than that of the semiconductor layer. The ohmic contact layer OCL may include two portions spaced apart from each other; for example, the constituent portions of the ohmic contact layer OCL may be spaced apart each other in a horizontal direction. In an embodiment of the inventive concept, the ohmic contact layer OCL may have an integrated shape.

The output electrode DE and the input electrode SE are disposed on the activation part AL. The output electrode DE and the input electrode SE are spaced apart from each other. A second insulation layer 20 covering the activation part AL, the output electrode DE, and the input electrode SE is disposed on the first insulation layer 10. A third insulation layer 30 is disposed on the second insulation layer 20. The second insulation layer 20 and the third insulation layer 30 may each include an inorganic material and/or an organic material. For example, the third insulation layer 30 may be a single organic layer providing a flat surface. In this embodiment, the third insulation layer 30 may include a plurality of color filters. A fourth insulation layer 40 is disposed on the third insulation layer 30. The fourth insulation layer 40 may be an inorganic layer which at least partially covers the color filters.

As illustrated in FIG. 3A, a pixel electrode PE is disposed on the fourth insulation layer 40. The pixel electrode PE is connected to the output electrode DE through the contact hole CH-L which penetrates the second insulation layer 20, the third insulation layer 30, and the fourth insulation layer 40. An alignment layer LC covering the pixel electrode PE may be disposed on the fourth insulation layer 40.

The second base substrate BS2 may be and/or include a glass substrate, a plastic substrate, and a substrate including polyimide (PI). A black matrix layer BM is disposed on a bottom surface of the second base substrate BS2. Openings corresponding to the pixel areas may be defined in the black matrix layer BM. A spacer CS may overlap the black matrix layer BM.

The insulation layers covering the black matrix layer BM are disposed on the bottom surface of the second base substrate BS2. FIG. 3A illustrates an example of a fifth insulation layer 50 providing a flat surface. The fifth insulation layer 50 may include an organic material.

The common electrode CE may be disposed on the bottom surface of the second base substrate BS2. A common voltage may be applied to the common electrode CE. The common voltage and the pixel voltage may be different from each other.

The cross-section of the pixel PX illustrated in FIG. 3A is provided as an example. The first display substrate 100 and the second display substrate 200 may be turned upside down in the third direction DR3 (see FIG. 1). Color filters may be disposed on the second display substrate 200.

Although a liquid crystal display panel in a vertical alignment (VA) mode is described with reference to FIG. 3A, a liquid crystal display panel in an in-plane switching (IPS) mode, a fringe-field switching (FFS) mode, a planar to linear switching (PLS) mode, a super vertical alignment (SVA), or a surface-stabilized vertical alignment (SS-VA) mode may be applied to embodiments of the inventive concept.

Referring to FIG. 3B, the gradation display layer of the display panel DP (see FIG. 1) according to the embodiment of the inventive concept may include an organic emission layer. For example, the display panel DP may be an organic light emitting display panel.

The organic light emitting display panel includes a display substrate 100 and an encapsulation substrate 200. The display substrate 100 includes a first base substrate BS1, a circuit element layer DP-CL disposed on the first base substrate BS1, a display element layer DP-OLED disposed on the circuit element layer DP-CL, and a cover layer CL disposed on the display element layer DP-OLED. The encapsulation substrate 200 may include the second base substrate BS2, a black matrix layer BM disposed on the second base substrate BS2, and a color control layer CCL.

The circuit element layer DP-CL may include a plurality of insulation layers, a semiconductor pattern, a conductive pattern, and a signal line. The insulation layer, the semiconductor layer, and the conductive layer may be formed by a process such as coating, deposition, or the like. Thereafter, the insulation layer, the semiconductor layer, and the conductive layer may be selectively patterned in a photolithography manner. The semiconductor pattern, the conductive pattern, and the signal line, which are provided in the circuit element layer DP-CL and the display element layer DP-OLED, may be formed by one or more of the above-described manners.

The first base substrate BS1 may include a synthetic resin film. In addition, the first base substrate BS1 may include a glass substrate, a metal substrate, and an organic/inorganic composite substrate.

The buffer layer BFL is disposed on the first base substrate BS1. The buffer layer BFL may increase bonding force between the first base substrate BS1 and the semiconductor pattern. The buffer layer BFL may include a silicon oxide layer and a silicon nitride layer. The silicon oxide layer and the silicon nitride layer may be alternately laminated.

The semiconductor pattern is disposed on the buffer layer BFL. The semiconductor pattern may include polysilicon. However, the embodiment of the inventive concept is not necessarily limited thereto. For example, the semiconductor pattern may include amorphous silicon or metal oxide.

The semiconductor pattern may include a doped region and a non-doped region. The doped region may be doped with an N-type dopant or a P-type dopant. For example, a P-type transistor includes a doped region into which the P-type dopant is doped.

The doped region may have conductivity greater than that of the non-doped region and may function as an electrode or a signal line. The non-doped region may substantially correspond to an active (or a channel) of the transistor. For example, a portion of the semiconductor pattern may be an active of the transistor, another portion may be a source or drain of the transistor, and another portion may be a connection electrode or a connection signal line.

The transistor T1 is disposed on the buffer layer BFL. A source Si, an active A1, and a drain D1 of the transistor T1 are formed from the semiconductor pattern. FIG. 3B illustrates a portion of the connection signal line SCL formed from the semiconductor pattern. The connection signal line SCL may be connected to the drain D1 of the transistor TR on the plane.

The first to sixth insulation layers 10 to 60 are disposed on the buffer layer BFL. Each of the first insulation layer 10 to the sixth insulation layer 60 may be an inorganic layer or an organic layer. The gate GI is disposed on the first insulation layer 10. An upper electrode UE may be disposed on the second insulation layer 20. The first connection electrode CNE1 may be disposed on the third insulation layer 30. The first connection electrode CNE1 may be connected to the signal line SCL through a contact hole CNT-1 which penetrates the first to third insulation layers 10 to 30. A second connection electrode CNE2 may be disposed on the fifth insulation layer 50. The second connection electrode CNE2 may be connected to the first connection electrode CNE1 through a contact hole CNT-2 which penetrates the fourth insulation 40 and the fifth insulation layer 50.

A light emitting element OLED is disposed on the sixth insulation layer 60. A first electrode AE is disposed on the sixth insulation layer 60. The first electrode AE is connected to the second connection electrode CNE2 through a contact hole CNT-3 which penetrates the sixth insulation layer 60.

The display element layer DP-OLED includes the light emitting element OLED and a pixel defining layer PDL. For example, the pixel defining layer PDL may be an organic layer. The light emitting element OLED may include a first electrode AE, a hole control layer HCL, an emission layer EML, an electron control layer ECL, and a second electrode CE.

The pixel defining layer PDL is disposed on the sixth insulation layer 60. The pixel defining layer PDL includes an opening OP (hereinafter, referred to as an emission opening). The emission opening OP of the pixel defining layer PDL may expose at least a portion of the first electrode AE. In an embodiment of the inventive concept, the pixel defining layer PDL may have a black color. The pixel defining layer PDL may include a black coloring agent. For example, the pixel defining layer PDL may include a black dye and a black pigment, which are mixed with a base resin.

FIG. 3B illustrates an emission area PXA and a non-emission area NPXA adjacent to the emission area PXA. The emission area PXA may substantially correspond to a portion of the first electrode AE exposed by the emission opening OP.

The hole control layer HCL may be commonly disposed on the emission area PXA and the non-emission area NPXA. The hole control layer HCL may include a hole transport layer and may further include a hole injection layer. The emission layer EML is disposed on the hole control layer HCL. The emission layer EML may be disposed on an area corresponding to the emission opening OP.

An electron control layer ECL is disposed on the emission layer EML. The electron control layer ECL may include an electron transport layer and may further include an electron injection layer. The second electrode CE is disposed on the electron control layer ECL.

The cover layer CL is disposed on the second electrode CE. The cover layer CL may include a plurality of thin films. In this embodiment, the cover layer CL may include a capping layer and a thin film encapsulation layer.

The second base substrate BS2 may be spaced apart from the cover layer CL in the thickness direction. The second base substrate BS2 may be and/or include a glass substrate, a plastic substrate, and a substrate including polyimide (PI).

The color control layer CCL may transmit a first color light or convert the first color light into second color light or third color light according to a color of light provided by the light emitting element OLED. The color control layer CCL may include quantum-dots. For example, the first color light may be blue light.

The black matrix layer BM may overlap the non-emission area NPXA. The black matrix layer BM may have a black color. For example, the black matrix layer BM may include a material that substantially absorbs visible light, but it is not necessarily limited thereto.

Figure 5:
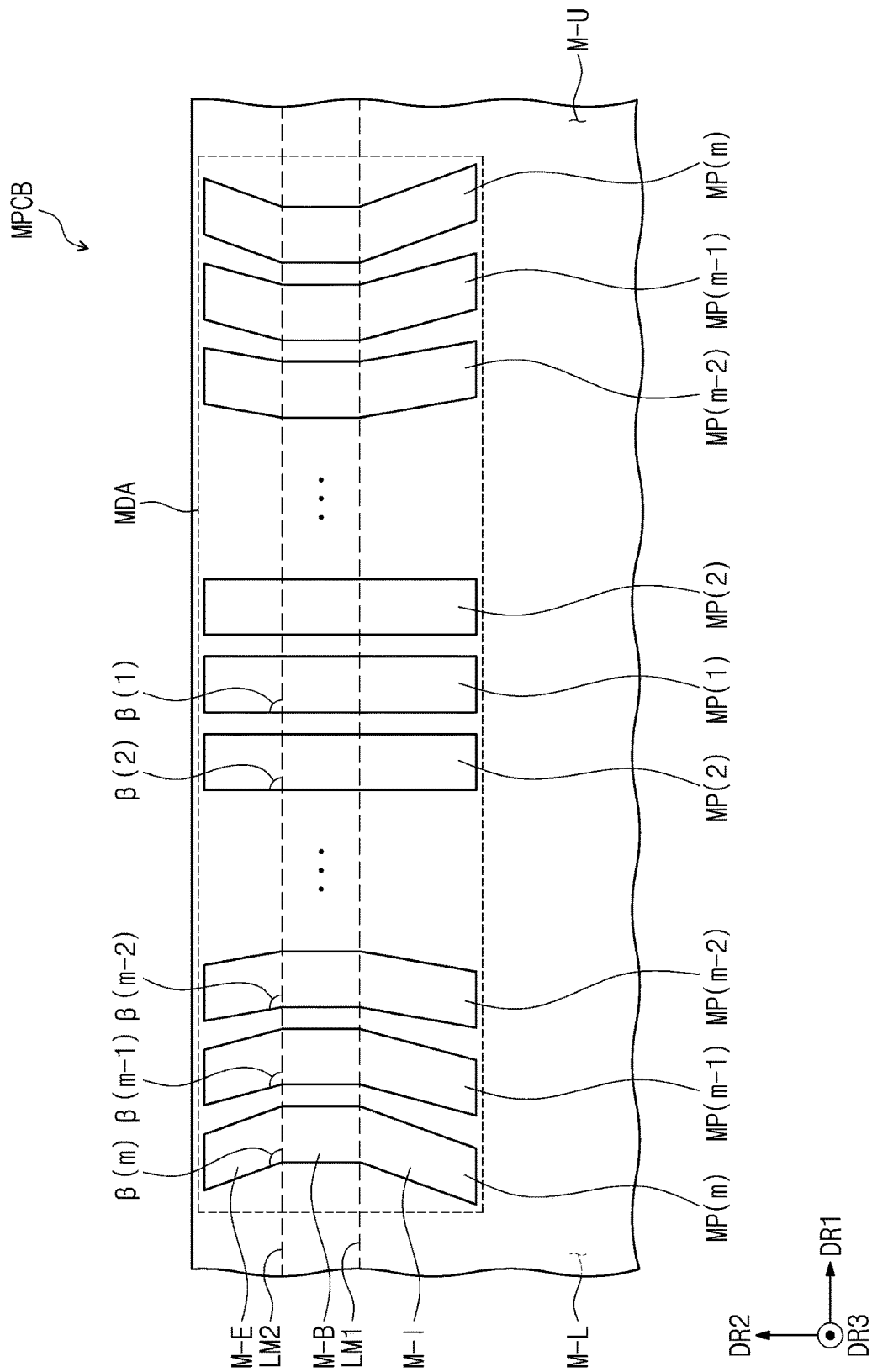
FIG. 5 is an enlarged view illustrating one area of a main circuit board according to an embodiment of the inventive concept.
Figure 6:
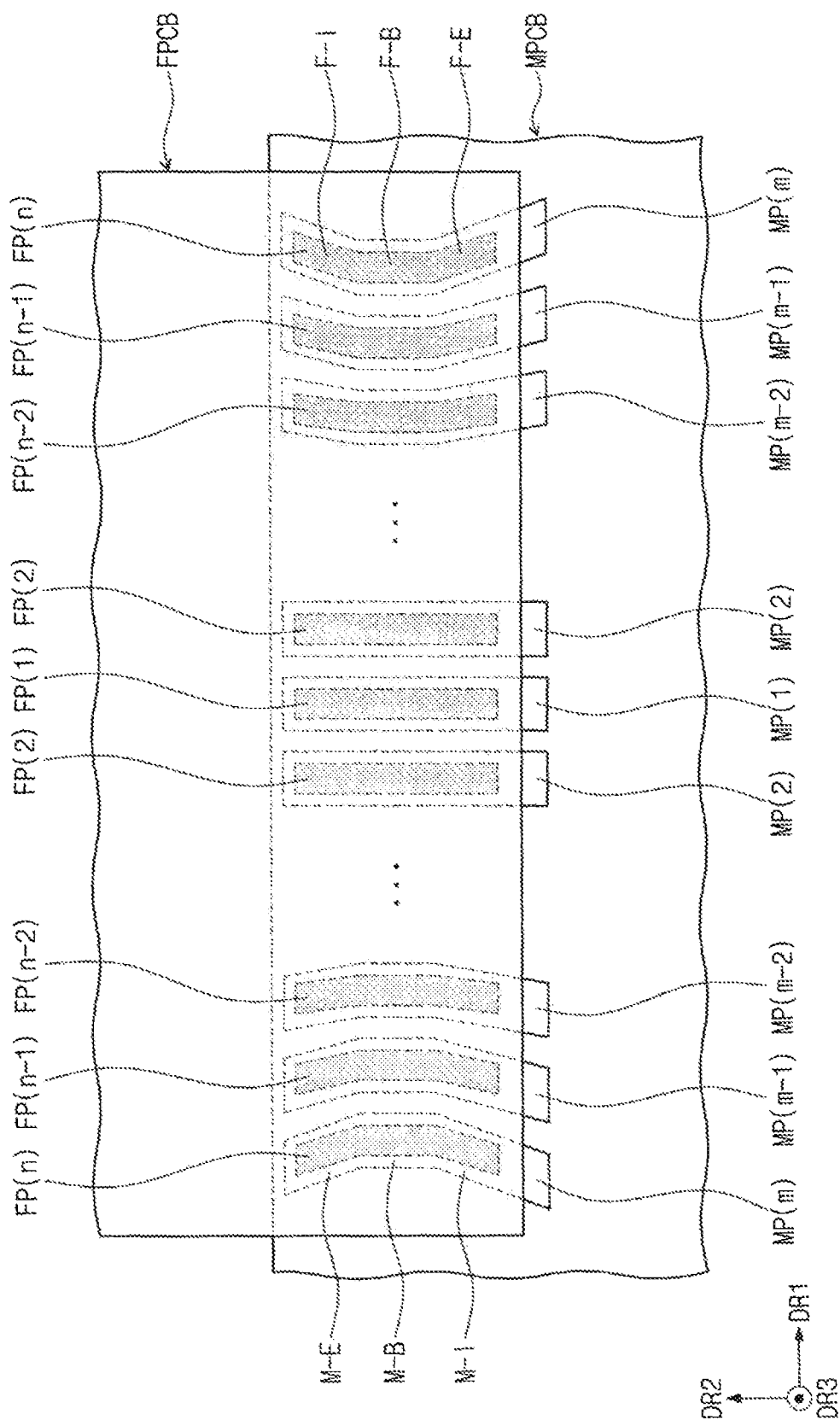
FIG. 6 is a plan view illustrating a coupling relationship between the flexible circuit board and the main circuit board according to an embodiment of the inventive concept.
Figure 7:
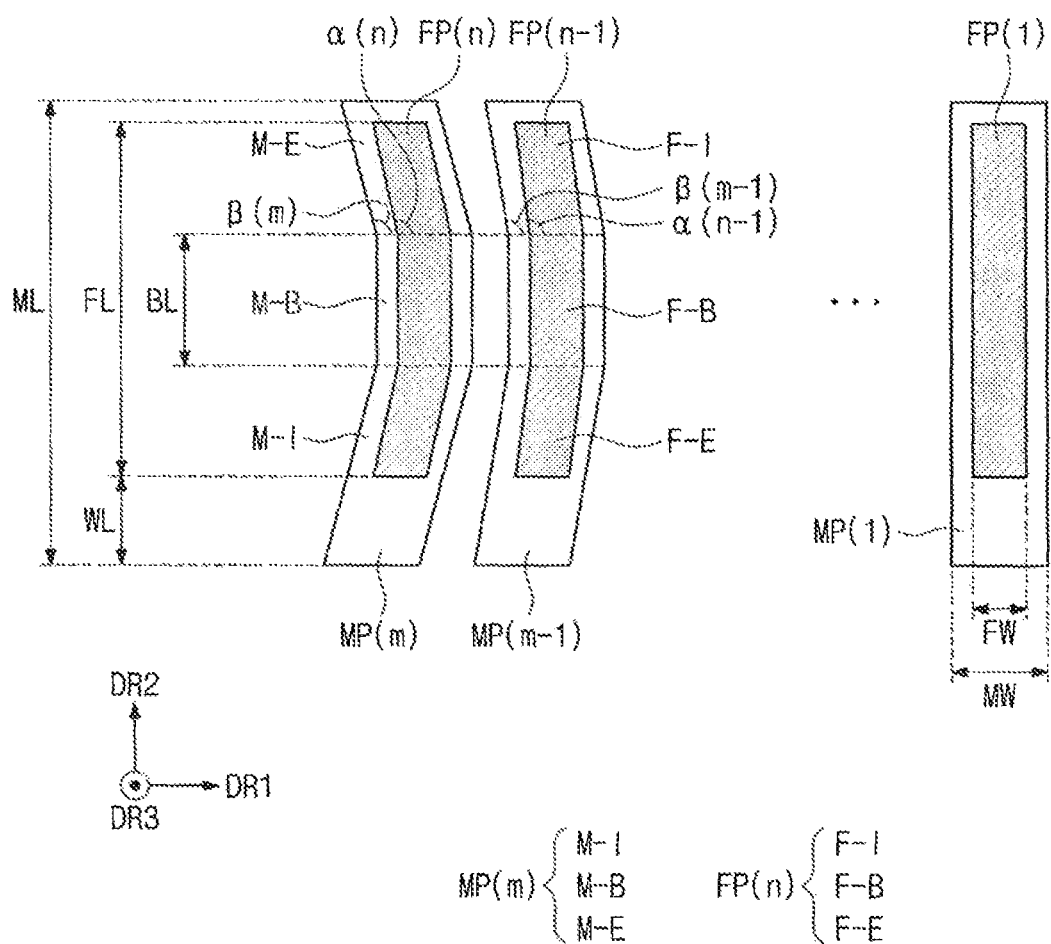
FIG. 7 is a plan view illustrating a coupling relationship between pads of the flexible circuit board and the main circuit board according to an embodiment of the inventive concept.

FIG. 4 is an enlarged view illustrating one area of the flexible circuit board according to an embodiment of the inventive concept. FIG. 5 is an enlarged view illustrating one area of the main circuit board according to an embodiment of the inventive concept. FIG. 6 is a plan view illustrating a coupling relationship between the flexible circuit board and the main circuit board according to an embodiment of the inventive concept. FIG. 7 is a plan view illustrating a coupling relationship between pads of the flexible circuit board and the main circuit board according to an embodiment of the inventive concept.

FIG. 4 illustrates flexible pads FP(1) to FP(n) disposed on the flexible pad area FDA of the flexible circuit board FPCB according to an embodiment. The flexible pads FP(1) to FP(n) may be disposed on the rear surface F-L of the flexible circuit board FPCB.

Hereinafter, regarding the flexible pads FP(1) to FP(n) to be described according to an embodiment of the inventive concept, the flexible pads FP(1) to FP(n) may be arranged in the first direction DR1 based on the first flexible pad FP(1) disposed at a center of the flexible pads FP(1) to FP(n) and may further be horizontally symmetrical to each other. Accordingly, the same reference numerals may be used for two pads symmetrically spaced around a center pad, and the same description may be applied to configurations to which the same reference numerals are assigned.

In the flexible pads FP(1) to FP(n) according to an embodiment of the inventive concept, a portion of the flexible pads FP(1) to FP(n) may be gradually tilted from the first flexible pad FP(1) disposed at the center of the flexible circuit board FPCB toward the n-th flexible pad FP(n) disposed at an outer side in the first direction DR1. For example, a portion of the flexible pads may have a more severe tilt near either outer side of the flexible circuit board FPCB than a portion of pads disposed near the center of the flexible circuit board FPCB.

The flexible pads FP(1) to FP(n) may be arranged along the first direction DR1, and each of the flexible pads FP(1) to FP(n) may substantially extend in the second direction DR2.

Each of the flexible pads FP(1) to FP(n) may include a first central portion F-B, a first outer titled portion F-E, and a first inner tilted portion F-I. Each of the first outer tilted portion F-E and the first inner tilted portion F-I may be tilted from the first central portion F-B.

Hereinafter, since angles of the first outer tilted portion F-E and the first inner tilted portion F-I, which are tilted from the first central portion F-B, may be the same, the angle of the first inner tilted portion F-I will be described.

In the embodiment of the inventive concept, the angles of the first outer tilted portion F-E and the first inner tilted portion F-I, which are tilted from the first central portion F-B, may correspond to angles of the first outer tilted portion F-E and the first inner tilted portion F-I tilted from extension lines LF2 and LF1 respectively.

In FIG. 4, the boundary between the first central portion F-B and the first inner tilted portion F-I of each of the flexible pads FP(1) to FP(n) is illustrated as a first extension line LF1. The boundary between the first central portion F-B and the first outer tilted portion F-E of each of the flexible pads FP(1) to FP(n) is illustrated as a second extension line LF2.

In this embodiment, each of the first outer tilted portion F-E and the first inner tilted portion F-I of each of the flexible pads FP(1) to FP(n) may be tilted from the first central portion F-B toward the outside of the flexible circuit board FPCB.

A first angle $\alpha(1)$ at which each of the first outer tilted portion F-E and the first inner tilted portion F-I are tilted from the first central portion F-B of the first flexible pad FP(1) according to an embodiment of the inventive concept may be a right angle. For example, the angle $\alpha(1)$ of both the first outer and inner tilted portions F-E and F-I of the first flexible pad FP(1) may be about 90°, which may correspond to a zero tilt. Hereinafter, the angles of both the first inner tilted portions F-I and the first outer tilted portions F-E of the plurality of flexible pads FP(1) to FP(n) may be generalized to "tilt angles" when referring to the plurality of angles. Moving outwards from $\alpha(1)$ to other flexible pads FP(2), FP(n-2), FP(n-1), FP(n), etc., the n-th angle $\alpha(n)$ therein may be greater than or equal to about 90 degrees and less than or equal to about 180 degrees.

According to an embodiment of the inventive concept, the tilt angles may increase from the first angle $\alpha(1)$ to the n-th angle $\alpha(n)$. According to an embodiment, a difference between the adjacent angles may be the same (e.g.: $\alpha(n-1)-\alpha(n-2)=\alpha(n)-\alpha(n-1)$). Thus, the tilt angles may increment equally from the first angle $\alpha(1)$ to the n-th angle $\alpha(n)$.

According to the inventive concept, each of the first outer tilted portion F-E and the first inner tilted portion F-I may be tilted from the first central portion F-B towards a direction starting from the first flexible pad FP(1) and going to the n-th flexible pad FP(n). An angle $\alpha(n)$ at which the first outer tilted portion F-E of the n-th flexible pad FP(n) disposed at the outermost side is tilted from the first central portion F-B may be greater than the angle at which the first outer tilted portion F-E of the other flexible pads is tilted from the first central portion F-B. In other words, the angle $\alpha(n)$ at the outermost flexible pads on each side may be the most severe (i.e., the most tilted) compared to the angles of the flexible pads disposed between the outermost pads.

However, the embodiment of the inventive concept is not necessarily limited thereto. For example, a difference between the adjacent angles may gradually increase (e.g.: $\alpha(n-1)-\alpha(n-2)<\alpha(n)-\alpha(n-1)$) from the first flexible pad FP(1) to the n-th flexible pad FP(n). Thus, the tilt angles may increase gradually from the first angle $\alpha(1)$ to the n-th angle $\alpha(n)$.

FIG. 5 illustrates main pads MP(1) to MP(m) disposed on the main pad area MDA of the main circuit board MPCB according to an embodiment. As illustrated in FIG. 5, the main pad area MDA may be provided as a plurality of areas on the main circuit board MPCB which correspond to the number of the flexible circuit boards FPCB as illustrated in FIG. 1. Hereinafter, for convenience of description, main pads MP(1) to MP(m) which are disposed on one main pad area MDA connected to one main circuit board MPCB will be described.

The main pads MP(1) to MP(m) may be disposed on the front surface M-U of the main circuit board MPCB. Hereinafter, the main pads MP(1) to MP(m) according to an embodiment of the inventive concept may be horizontally symmetrical to each other. For example, the main pads MP(1) to MP(m) may be arranged in the first direction DR1 centered around the first main pad MP(1), with incrementing main pad numbers on each side. Therefore, the same reference numerals may be used for pairs of main pads symmetrical about the first main pad MP(1), and the same description may be applied to configurations to which the same reference numerals are assigned.

In the main pads MP(1) to MP(m) according to an embodiment of the inventive concept, a portion of the main pads MP(1) to MP(m) may be gradually tilted from the first main pad MP(1) disposed at the center of the main circuit board MPCB toward the m-th main pad MP(m) disposed at an outer side in the first direction DR1.

The main pads MP(1) to MP(m) may be arranged in the first direction DR1, and each of the main pads MP(1) to MP(m) may substantially extend in the second direction DR2.

Each of the main pads MP(1) to MP(m) may include a second central portion M-B, a second outer tilted portion M-E, and a second inner tilted portion M-I. Each of the second outer tilted portion M-E and the second inner tilted portion M-I may be tilted from the second central portion M-B.

Hereinafter, since angles of the second outer tilted portion M-E and the second inner tilted portion M-I, which are tilted from the second central portion M-B, may be the same, the angle of the second outer tilted portion M-E, which is tilted from the second central portion M-B, will be described. Similar to the above description, these angles may be generally referred to as "tilt angles."

In the embodiment of the inventive concept, the angles of the second outer tilted portion M-E and the second inner tilted portion M-I which are tilted from the second central portion M-B, may correspond to angles of the second outer tilted portion M-E and the second inner tilted portion M-I which are tilted from extension lines LM2 and LM1 respectively.

In FIG. 5, the boundary between the second central portion M-B and the second inner tilted portion M-I of each of the main pads MP(1) to MP(m) is a first extension line LM1. Also, the boundary between the second central portion M-B and the second outer tilted portion M-E of each of the main pads MP(1) to MP(m) is a second extension line LM2.

In this embodiment, each of the second outer tilted portion M-E and the second inner tilted portion M-I of each of the main pads MP(1) to MP(m) may be tilted from the second central portion M-B toward the outside of the main circuit board MPCB.

A first angle $\beta(1)$ at which the second outer tilted portion M-E and the second inner tilted portion M-I are tilted from the second central portion M-B of the first main pad MP(1) according to an embodiment of the inventive concept may be a right angle. For example, the first angle $\beta(1)$ may be about 90°, which may correspond to a zero tilt. Moving outwards from the first angle $\beta(1)$, the m-th angle $\beta(m)$ may be greater than or equal to about 90 degrees and less than or equal to about 180 degrees.

According to an embodiment of the inventive concept, the tilt angles may increase from the first angle $\beta(1)$ to the m-th angle $\beta(m)$. According to an embodiment, a difference between the adjacent angles may be the same (e.g.: $\beta(m-1)-\beta(m-2)=\beta(m)-\beta(m-1)$). For example, the tilt angles may increase equally from the first angle $\beta(1)$ to the m-th angle $\beta(m)$.

According to an embodiment of the inventive concept, each of the second outer tilted portion M-E and the second inner tilted portion M-I may be tilted from the second central portion M-B in a direction that begins at the first main pad MP(1) and directs to the m-th main pad MP(m). Here, an m-th angle $\beta(m)$ at which the second outer tilted portion M-E (the second inner tilted portion M-I) of the m-th main pad MP(m) disposed at the outermost side is tilted from the second central portion M-B may be the largest compared to the tilted angles of other main pads. In other words, the m-th angle $\beta(m)$ corresponding to the two outermost main pads MP(m) may be the most severe (i.e., the most tilted) angle, compared to the angles of the main pads disposed between the outermost main pads.

However, the embodiment of the inventive concept is not necessarily limited thereto. For example, a difference between the adjacent angles may gradually increase (e.g.: $\beta(m-1)-\beta(m-2)<\beta(m)-\beta(m-1)$) from the first main pad MP(1) to the m-th main pad MP(m). Thus, the tilt angles may increase gradually from the first angle $\beta(1)$ to the m-th angle $\beta(n)$.

FIG. 6 illustrates a state in which one flexible circuit board FPCB and the main circuit board MPCB are connected to each other on one area. In this illustration, the main pads of the main circuit board MPCB are illustrated by dotted lines, and the flexible pads of the flexible circuit board FPCB are indicated with a hatched fill.

According to an embodiment of the inventive concept, the flexible pads FP(1) to FP(n) provided in the flexible circuit board FPCB and the main pads MP(1) to MP(m) provided in the main circuit board MPCB, which overlap each other in the third direction DR3 may overlap each other in a one-to-one manner.

Hereinafter, when flexible pads FP(1) to FP(n) are described as overlapping main pads MP(1) to MP(m), the flexible pads FP(1) to FP(n) may at least partially or substantially overlap the main pads MP(1) to MP(m). In other words, the shapes of the flexible pads FP(1) to FP(n) may substantially follow the shapes of the corresponding main pads MP(1) to MP(m), and the main pads MP(1) to MP(m) may completely overlap the flexible pads FP(1) to FP(n) in a plan view.

For example, the first flexible pad FP(1) may overlap the first main pad MP(1), and the second flexible pad FP(2) may overlap the second main pad MP(2). Also, the (n−1)-th flexible pad FP(n−1) may overlap the (m−1)-th main pad MP(m−1), and the n-th flexible pad FP(n) may overlap the m-th main pad MP(m).

According to an embodiment of the inventive concept, the first central portion F-B provided in each of the flexible pads FP(1) to FP(n) may overlap the second central portion M-B of the corresponding main pads MP(1) to MP(m), and the first outer tilted portion F-E provided in each of the flexible pads FP(1) to FP(n) may overlap the second inner tilted portion M-I of the corresponding main pads MP(1) to MP(m). Also, the first inner tilted portion F-I provided in each of the flexible pads FP(1) to FP(n) may overlap the second outer tilted portion M-E of the corresponding main pads MP(1) to MP(m).

According to an embodiment of the inventive concept, the angles of each of the first outer tilted portion F-E and the first inner tilted portion F-I, which are tilted from the first central portion F-B, may gradually increase from the first flexible pad FP(1) to the n-th flexible pad FP(n). Similarly, the angles of the second outer tilted portion M-E and the second inner tilted portion M-I, which are tilted from the second central portion M-B, may gradually increase from the first main pad MP(1) to the m-th main pad MP(m). Accordingly, each of the flexible pads FP(1) to FP(n) may have shapes similar to those of each of the corresponding main pads MP(1) to MP(m).

FIG. 7 schematically illustrates the main pads MP(1) to MP(m) and the flexible pads FP(1) to FP(n). Referring to FIG. 7, each of the main pads MP(1) to MP(m) may have an area greater than the area of each of the corresponding flexible pads FP(l) to FP(n).

Each of the main pads MP(1) to MP(m) according to an embodiment of the inventive concept may be longer than each of the flexible pads FP(1) to FP(n). For example, the first flexible pad (FP(1)) may have a first width FW in the first direction DR1, and the first main pad MP(1) may have a second width MW in the first direction DR1. The second width MW may be greater than the first width FW. This relation of the first width FW to the second width MW may be applied to the flexible pads FP(1) to FP(n) and the main pads MP(1) to MP(m).

The n-th flexible pad FP(n) may have a first length FL in the second direction DR2, and the m-th main pad MP(m) may have a second length ML in the first direction DR2. The second length ML may be greater than the first length FL. This relation of the first length FL to the second length ML may be applied to the flexible pads FP(1) to FP(n) and the main pads MP(1) to MP(m).

According to an embodiment of the inventive concept, a length of the first inner tilted portion F-I of each of the flexible pads FP(1) to FP(n) in the second direction DR2 may be the same as or similar to that of the second outer tilted portion M-E of each of the main pads MP(1) to MP(m). Also, a length of the first central portion F-B of each of the flexible pads FP(1) to FP(n) in the second direction DR2 may be the same as or similar to that of the second central portion M-B of each of the main pads MP(1) to MP(m). However, while the above-described lengths may be similar to each other, the second length ML of a given main pad, which includes the lengths of the second outer tilted portion M-E, the second inner tilted portion M-I, and the second central portion M-B may still be longer than the first length FL for a corresponding flexible pad.

A length of the first outer tilted portion F-E of each of the flexible pads FP(1) to FP(n) in the second direction DR2 may be less than that of the second inner tilted portion M-I of each of the main pads MP(1) to MP(m). Therefore, when the flexible pads FP(1) to FP(n) and the main pads MP(1) to MP(m) are coupled to each other, a portion of the second inner tilted portion M-I may be exposed by the first outer tilted portion F-E.

According to an embodiment of the inventive concept, in the second inner tilted portion M-I, a length WL of a protrusion exposed by the first outer tilted portion F-E may be less than half of a length BL of the second central portion M-B.

According to an embodiment of the inventive concept, a difference between the first angle β(1) and the first angle α(1), a difference between the second angle β(2) and the second angle α(2), a difference between the (m−1)-th angle β(m−1) and the (n−1)-th angle α(n−1), and a difference between the m-th angle β(m) and the n-th angle α(n) may gradually increase from the pad disposed at the center to the pad disposed at the outer side among the pads. In other words, the difference between an angle and the following incremented angle, for α and β, may increase with each increment towards the outer sides of the flexible and main circuit boards.

According to an embodiment of the inventive concept, the increment from the first angle β(1) to the m-th angle β(m) may be larger than the increment from the first angle α(1) to the n-th angle α(n).

Thus, in the tilted angles of the connected pads, a tilted angle of each of the main pads MP(1) to MP(m) may be greater than that of each of the flexible pads FP(1) to FP(n). Thus, the n-th angle α(n) at which the first outer tilted portion F-I is tilted from the first central portion F-B of the n-th flexible pad FP(n), which is disposed at the outermost side, may be less than m-th angle β(m) at which the second inner tilted portion M-E is tilted from the second central portion M-B of the m-th main pad MP(m), which overlaps the n-th flexible pad FP(n) and is also disposed at the outermost side.

Figure 8:
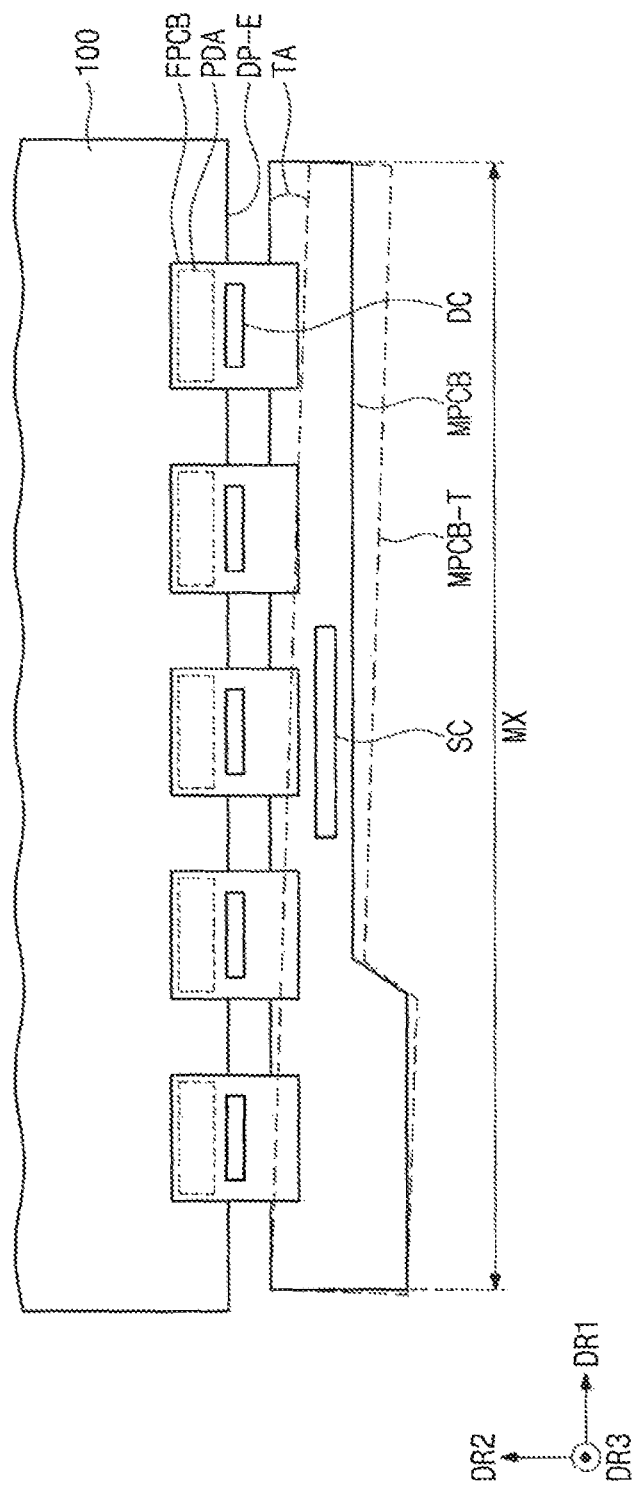
FIG. 8 is a plan view illustrating a coupling relationship between a portion of the display panel and the main circuit board according to an embodiment of the inventive concept.
Figure 9:
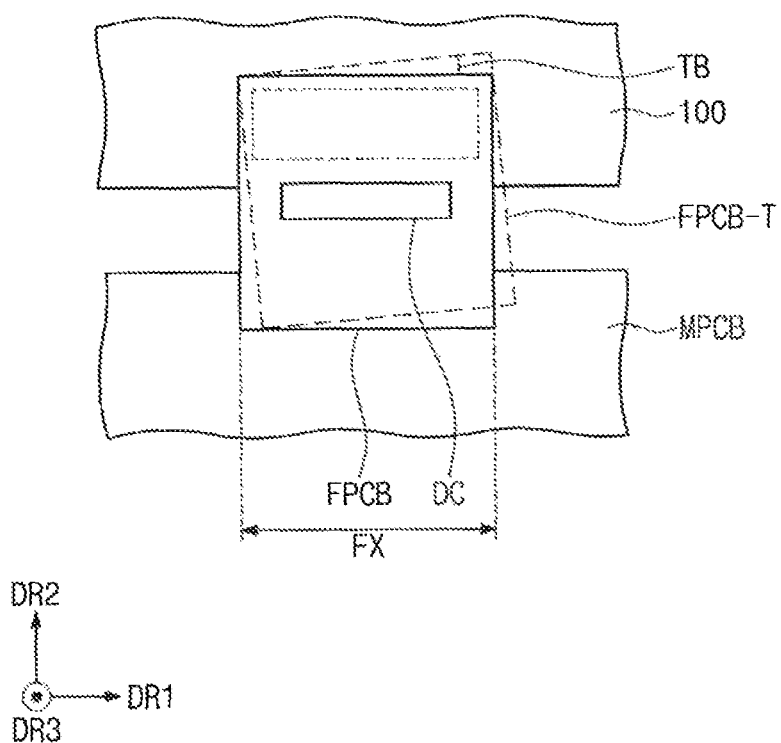
FIG. 9 is a plan view illustrating a coupling relationship between a portion of the display panel, the flexible circuit board, and the main circuit board according to an embodiment of the inventive concept.
Figure 10:
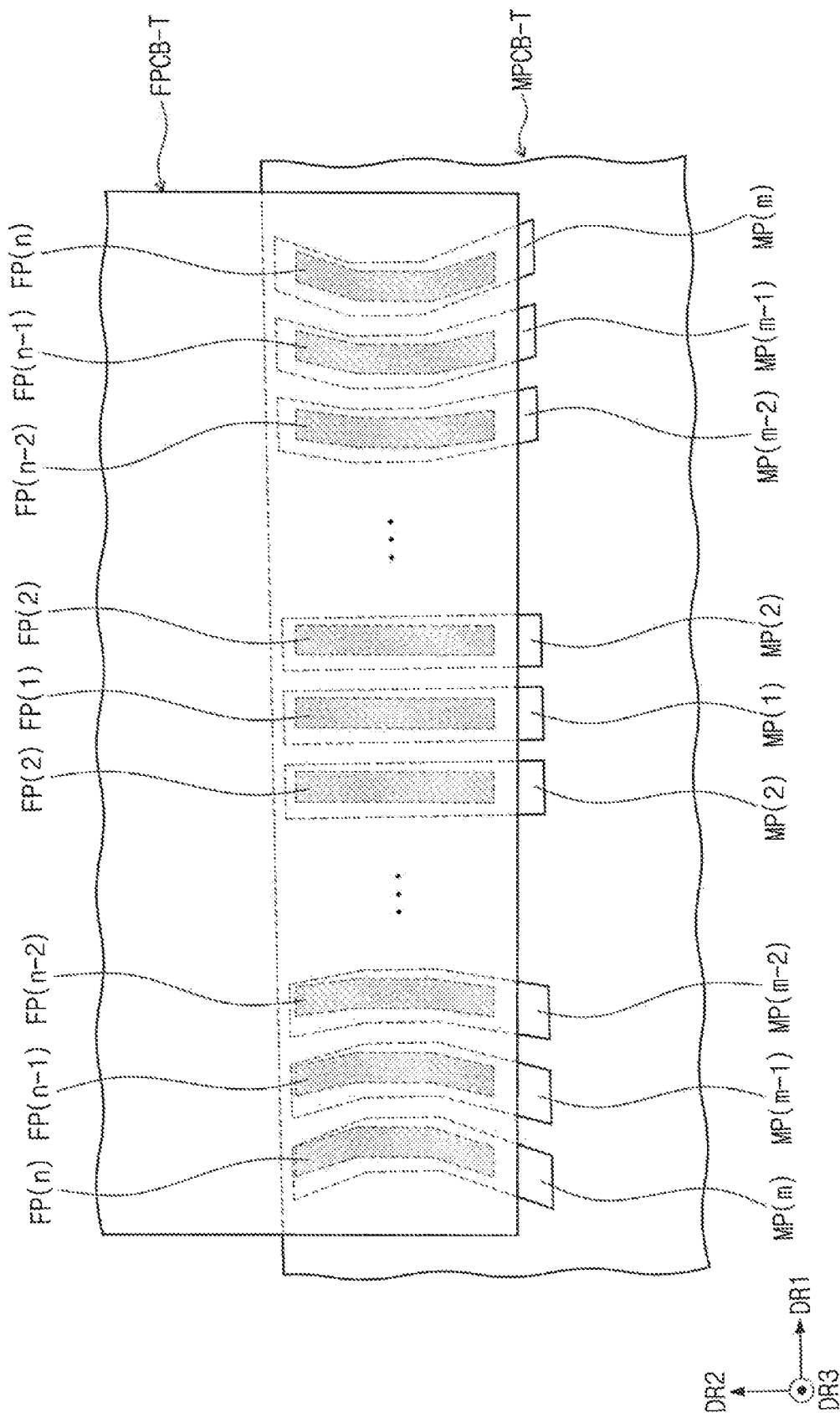
FIG. 10 is a plan view illustrating a coupling relationship between the flexible circuit board and the main circuit board according to an embodiment of the inventive concept.

FIG. 8 is a plan view illustrating a coupling relationship between a portion of the display panel and the main circuit board according to an embodiment of the inventive concept. FIG. 9 is a plan view illustrating a coupling relationship between a portion of the display panel, the flexible circuit board, and the main circuit board according to an embodiment of the inventive concept. FIG. 10 is a plan view illustrating a coupling relationship between the flexible circuit board and the main circuit board according to an embodiment of the inventive concept.

FIGS. 8 to 9 illustrate connection types in which misalignment may occur while the flexible circuit board FPCB and the main circuit board MPCB are pressed using the pressing bar, and FIG. 10 illustrates a coupling relationship between the flexible pads and the main pads according to an embodiment of the inventive concept.

Referring to FIGS. 8 and 9, each of the flexible circuit boards FPCB and the main circuit board MPCB may be attached to each other by being pressed with a pressing bar. The pressing bar may be provided as one pressing bar extending in the first direction DR1 to cover all of the flexible circuit boards FPCB, or each of the flexible circuit boards FPCB may be respectively pressed by individual pressing bars. In this case, an error due to distortion of the main circuit board MPCB-T may occur, wherein the misalignment forms the main circuit board MPCB-T at as much as a maximum first angle TA when compared to a normally attached main circuit board MPCB.

In this case, the first angle TA may satisfy Equation 1 below.

$$TA = \sin^{-1}(2a/MX) \qquad \text{[Equation 1]}$$

('a' is a y-axis tolerance that may occur in the fixed state when being pressed using the pressing bar, and 'MX' is a length of the main circuit board MPCB in the first direction DR1).

Also, an error due to distortion of the flexible circuit board FPCB-T may occur in the process pressing using the pressing bar, wherein the misalignment forms the flexible circuit board FPCB-T at as much as a maximum second angle TB when compared to a normally attached flexible circuit board FPCB.

In this case, the second angle TB may satisfy Equation 2 below.

$$TB = \sin^{-1}(2b/FX) \qquad \text{[Equation 2]}$$

('b' is a y-axis tolerance that may occur in the fixed state when being pressed using the pressing bar, and 'FX' is a length of the flexible circuit board FPCB in the first direction DR1).

A maximum tilt angle that may occur when the flexible circuit board FPCB-T and the main circuit board MPCB-T are misaligned may be defined as the sum of an absolute value of the first angle TA and an absolute value of the second angle TB.

FIG. 10 illustrates a state in which the flexible circuit board FPCB-T and the main circuit board MPCB-T are coupled to each other at the maximum tilt angle due to the process error.

According to an embodiment of the inventive concept, the flexible pads FP(1) to FP(n) of the flexible circuit board FPCB-T and the main pads MP(1) to MP(m) of the main circuit board MPCB-T respectively include the tilted portions at which at least some of the pads are gradually tilted from the pad disposed at the center to the pad disposed at the outer side among the pads, as described above.

According to an embodiment of the inventive concept, since the tilted angle of each of the main pads MP(1) to MP(m) from the second central portion M-B to the second outer tilted portion M-E is greater than that of each of the corresponding flexible pads FP(1) to FP(n) from the first central portion F-B to the first inner tilted portion F-I, even if the flexible circuit board FPCB-T and the main circuit board MPCB-T are connected to be tilted with the process error, the flexible pads FP(1) to FP(n) may not be spaced apart from the main pads MP(1) to MP(m). Accordingly, the flexible pads FP(1) to FP(n) may still be fully connected to corresponding main pads MP(1) to MP(m). Therefore, even if the flexible circuit board FPCB-T or the main circuit board MPCB-T are coupled with the maximum process error, the pad structure that is capable of compensating for the process defects may be provide a display apparatus having increased reliability.

Figure 11:
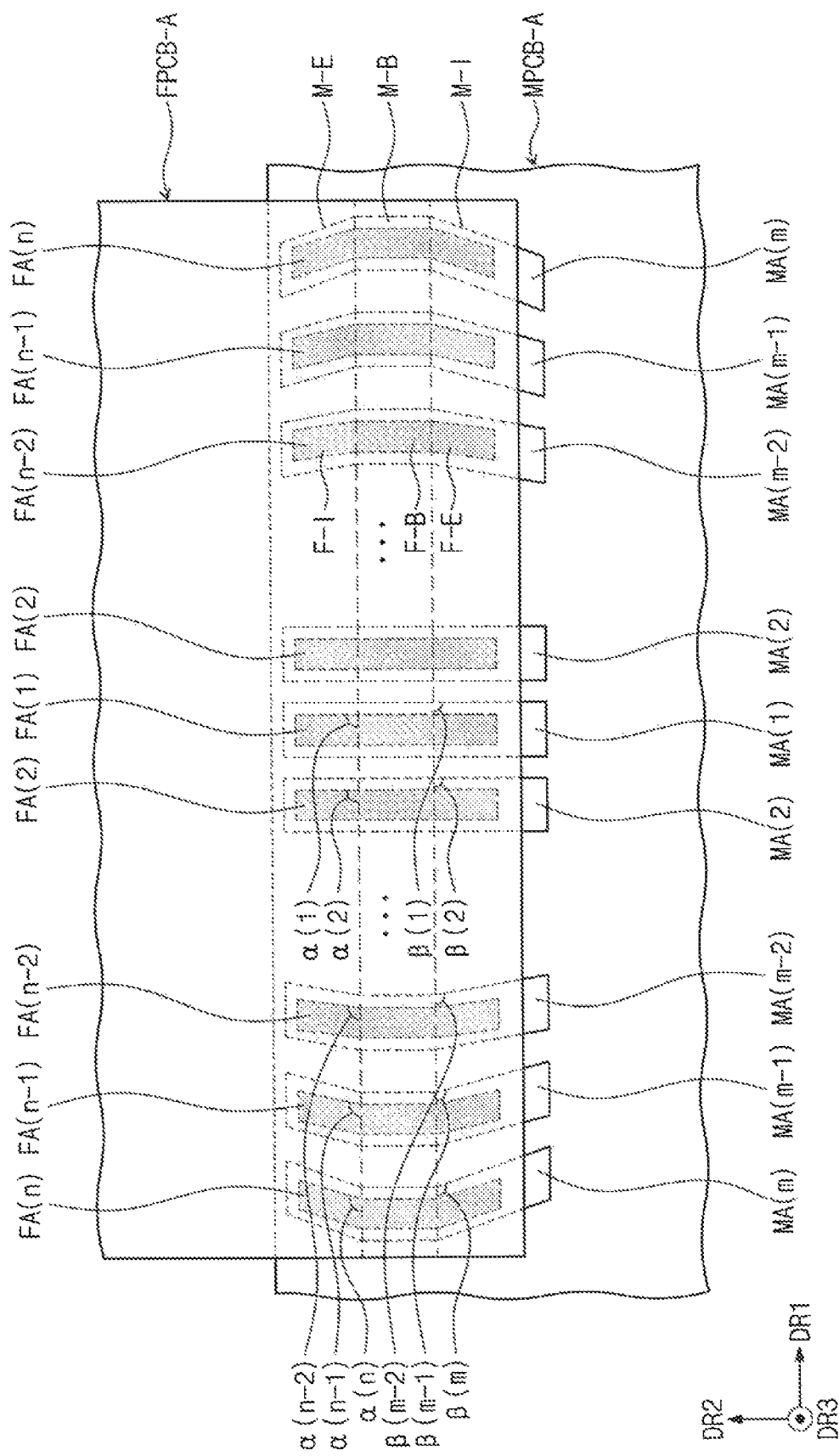
FIG. 11 is a plan view illustrating a coupling relationship between the flexible circuit board and the main circuit board according to an embodiment of the inventive concept.

FIG. 11 is a plan view illustrating a coupling relationship between the flexible circuit board and the main circuit board according to an embodiment of the inventive concept. The same/similar reference numerals are used for the same/similar configurations as in FIGS. 4 to 10, and redundant descriptions are omitted.

Referring to FIG. 11, the flexible circuit board FPCB-A according to an embodiment of the inventive concept may include flexible pads FA(1) to FA(n). The flexible pads FA(1) to FA(n) may be arranged along the first direction DR1, and each of the flexible pads FA(1) to FA(n) may substantially extend in the second direction DR2.

In the flexible pads FA(1) to FA(n) according to this embodiment, a portion of the flexible pads FA(1) to FA(n) may be gradually tilted from the first flexible pad FA(1) disposed at a center of the flexible circuit board FPCB-A toward the n-th flexible pad FA(n) disposed at an outer side in the first direction DR1.

Each of the flexible pads FA(1) to FA(n) may include a first central portion F-B, a first outer titled portion F-E, and a first inner tilted portion F-I. Each of the first outer tilted portion F-E and the first inner tilted portion F-I may be tilted with respect to the first central portion F-B.

In this embodiment, each of the first outer tilted portion F-E and the first inner tilted portion F-I of each of the flexible pads FA(1) to FA(n) may be tilted from the first central portion F-B toward the center of the flexible pads FA(1) to FA(n), respectively. This may contrast with earlier example embodiments, wherein the tilted portions F-I and F-E were tilted away from the center of the flexible pads FA(1) to FA(n), respectively.

An n-th angle α(n) at which each of the first outer tilted portion F-E and the first inner tilted portion F-I is tilted from the first central portion F-B of the outermost n-th flexible pad FA(n) may be maximum, and it may gradually decrease from the n-th angle α(n) to a first angle α(1) at which each of the first outer tilted portion F-E and the first inner tilted portion F-I is tilted from the first central portion F-B of the first flexible pad FA(n).

The main circuit board MPCB-A according to an embodiment of the inventive concept may include main pads MA(1) to MA(m). The main pads MA(1) to MA(m) are arranged along the first direction DR1, and each of the main pads MA(l) to MA(m) may substantially extend along the second direction DR2.

In the main pads MA(1) to MA(m) according to an embodiment of the inventive concept, a portion of the main pads MA(1) to MA(m) may be gradually tilted from the first main pad MA(1) disposed at the center of the main circuit board MPCB-A to the m-th main pad MA(m) disposed at the outer side in the first direction DR1.

Each of the main pads MA(1) to MA(m) may include a second central portion M-B, a second outer titled portion M-E, and a second inner tilted portion M-I. Each of the second outer tilted portion M-E and the second inner tilted portion M-I may be tilted from the second central portion M-B. The second outer tilted portion M-E may overlap the first inner tilted portion F-I, the second central portion M-B may overlap the first central portion F-B, and the second inner tilted portion M-I may overlap the first outer tilted portion F-E.

In this embodiment, each of the second outer tilted portion M-E and the second inner tilted portion M-I of each of the main pads MA(1) to MA(m) may be tilted from the second central portion M-B to the center of the main pads MA(1) to MA(m).

An m-th angle β(m) at which each of the second outer tilted portion M-E and the second inner tilted portion M-I is tilted from the second central portion M-B of the outermost m-th main pad MA(m) may be maximum, and it may gradually decrease from the m-th angle β(m) to a first angle β(1) at which each of the second outer tilted portion M-E and the second inner tilted portion M-I is tilted from the second central portion M-B of the m-th main pad MA(n).

According to an embodiment of the inventive concept, the angles of each of the first outer tilted portion F-E and the first inner tilted portion F-I, which are tilted from the first central portion F-B, may gradually increase from the first flexible pad FA(1) to the n-th flexible pad FA(n), and the angles of the second outer tilted portion M-E and the second inner tilted portion M-I, which are tilted from the second central portion M-B, may similarly gradually increase from the first main pad MA(1) to the m-th main pad MA(m). Thus, each of the flexible pads FA(1) to FA(n) may have shapes similar to that of each of the corresponding main pads MP(1) to MP(m).

In this embodiment, the tilted angle between the corresponding pads may be greater for the main pads MP(1) to MP(m) than the flexible pads FA(1) to FA(n).

Figure 12:
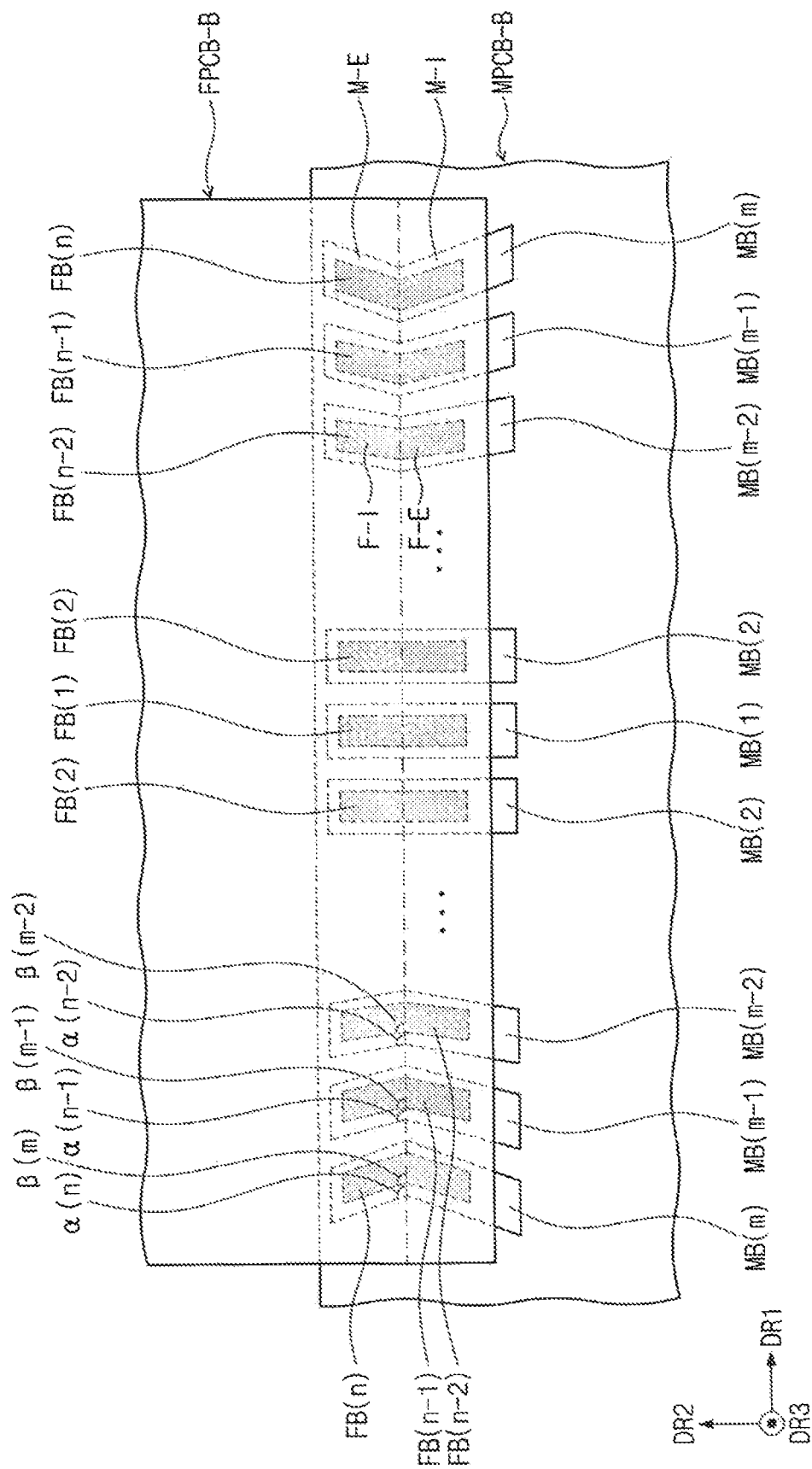
FIG. 12 is a plan view illustrating a coupling relationship between the flexible circuit board and the main circuit board according to an embodiment of the inventive concept.

FIG. 12 is a plan view illustrating a coupling relationship between the flexible circuit board and the main circuit board according to an embodiment of the inventive concept. The same/similar reference numerals are used for the same/similar configurations as in FIGS. 4 to 10, and redundant descriptions are omitted. By way of contrast with the earlier described embodiments, the main pads MB(1) to MB(m) and the flexible pads FB(1) to FB(n) may lack second central and first central portions, respectively.

Referring to FIG. 12, a flexible circuit board FPCB-B according to an embodiment of the inventive concept may include flexible pads FB(1) to FB(n). The flexible pads FB(1) to FB(n) may be arranged along the first direction DR1, and each of the flexible pads FB(1) to FB(n) may substantially extend in the second direction DR2.

In the flexible pads FB(1) to FB(n) according to this embodiment, a portion of the flexible pads FB(1) to FB(n) may be gradually tilted from the first flexible pad FB(1) disposed at the center of the flexible circuit board FPCB-B toward the n-th flexible pad FB(n) disposed at the outside in the first direction DR1.

Each of the flexible pads FB(1) to FB(n) may include a first outer titled portion F-E and a first inner tilted portion F-I. The first outer tilted portion F-E and the first inner tilted portion F-I may be tilted with respect to each other at a boundary.

In this embodiment, the first outer tilted portion F-E and the first inner tilted portion F-I of each of the flexible pads FB(1) to FB(n) may be tilted from the first flexible pad FB(1) disposed at the center to the n-th flexible pad FB(n) disposed at the outer side among the flexible pads FB(1) to FB(n). In other words, the inner and outer tilted portions F-I and F-E may be tilted outwardly towards the outer edges of the flexible circuit board FPCB-B. An angle defined by the first outer tilted portion F-E and the first inner tilted portion F-I may gradually increase outward from the center.

According to this embodiment, the main circuit board MPCB-B may include main pads MB(1) to MB(m). The main pads MB(1) to MB(m) may be arranged along the first direction DR1, and each of the flexible pads MB(1) to MB(m) may extend along the second direction DR2.

Each of the main pads MB(1) to MB(m) may include a second outer tilted portion M-E and a second inner tilted portion M-I. The second outer tilted portion M-E and the second inner tilted portion M-I may be tilted with respect to each other at a boundary.

Each of the main pads MB(1) to MB(m) according to this embodiment may have a shape corresponding to each of the flexible pads FB(1) to FB(n).

In this embodiment, the second outer tilted portion M-E and the second inner tilted portion M-I of each of the main pads MB(1) to MB(n) may be tilted from the second main pad MB(1) disposed at the center to the m-th main pad MB(m) disposed at the outer side among the main pads MB(1) to MB(n). In other words, the inner and outer tilted portions M-I and M-E may be tilted outwardly towards the outer edges of the main circuit board. An angle defined by the second outer tilted portion M-E and the second inner tilted portion M-I may gradually increase outward from the center. Also, an angle defined by the second outer tilted portion M-E and the second inner tilted portion M-I may be greater than that defined by the first outer tilted portion F-E and the first inner tilted portion F-I, which overlap each other.

According to the embodiments of the inventive concept, since the slope of the outer tilted portion from the center of each of the main pads is greater than that of the inner tilted portion from the center of each of the flexible pads corresponding to the main pads, even if the flexible circuit board and the main circuit board are connected and tilted by process error, the flexible pads may not be spaced apart from the main pads, and may be connected to the corresponding main pads.

Therefore, even if the flexible circuit board or the main circuit board are coupled with the process error, the pad structure of the present inventive concepts that is capable of compensating for the process defects may provide a display apparatus having increased reliability.

It will be apparent to those skilled in the art that various modifications and deviations can be made in the inventive concept. Thus, it is intended that the present disclosure covers the modifications and deviations of this invention provided they are within the scope of the appended claims and their equivalents.

Accordingly, the technical scope of the inventive concept should not be limited to the contents described in the detailed description of the specification, but should be determined by the claims.

What is claimed is:

1. A display apparatus comprising:
  a flexible circuit board comprising a driving chip, and further comprising flexible pads arranged in a first direction and substantially extending in a second direction crossing the first direction;
  a main circuit board comprising main pads connected to corresponding flexible pads in a third direction that is perpendicular to both the first direction and the second direction; and
  a display panel comprising a plurality of pixels connected to the flexible circuit board, wherein the plurality of pixels is configured to receive a signal from the driving chip,
  wherein, in each of the flexible pads and the main pads, a portion of each main pad and each corresponding flexible pad is tilted such that the tilt increases from a main pad and corresponding flexible pad disposed at a center area to a main pad and corresponding flexible pad disposed at an outer side, and
  a tilted angle of a main pad disposed at the outermost side of the main circuit board is greater than a tilted angle of a corresponding flexible pad disposed at the outermost side of the flexible circuit board.

2. The display apparatus of claim 1, wherein each of the flexible pads comprises a first central portion and a first outer tilted portion and a first inner tilted portion, wherein the first outer tilted portion and the first inner tilted portion are both tilted from the first central portion at the same angle, and
each of the main pads comprises a second central portion overlapping the first central portion of a corresponding flexible pad, and a second outer tilted portion which overlaps the first inner tilted portion of a corresponding flexible pad, and a second inner tilted portion which overlaps the first outer tilted portion of a corresponding flexible pad, and wherein the second outer tilted portion and the second inner tilted portion are both tilted from the second central portion at the same angle.

3. The display apparatus of claim 2, wherein a tilted angle of each of the flexible pads is defined as an angle at which each of the first outer tilted portion and the first inner tilted portion is tilted from the first central portion, and
a tilted angle of each of the main pads is defined as an angle at which each of the second outer tilted portion and the second inner tilted portion is tilted from the second central portion.

4. The display apparatus of claim 2, wherein the second inner tilted portion of each of the main pads protrudes from the first outer tilted portion of a corresponding flexible pad, and is exposed to an outside of the flexible printed circuit board.

5. The display apparatus of claim 4, wherein a length of the second inner tilted portion that protrudes in the second direction is less than half of a length of the second central portion in the second direction.

6. The display apparatus of claim 2, wherein each of the first outer tilted portion and the first inner tilted portion is tilted in an outward direction from the first central portion toward the outside of the flexible circuit board, and
each of the second outer tilted portion and the second inner tilted portion is tilted in the outward direction from the second central portion toward the outside of the main circuit board.

7. The display apparatus of claim 2, wherein each of the first outer tilted portion and the first inner tilted portion is tilted in an inward direction from the first central portion toward a center of the flexible circuit board, and
each of the second outer tilted portion and the second inner tilted portion is tilted in an inward direction from the second central portion toward a center of the main circuit board.

8. The display apparatus of claim 1, wherein each main pad of the main pads has an area greater than the area of the corresponding flexible pad that contacts it.

9. The display apparatus of claim 2, wherein the first central portion and the second central portion have the same length in the second direction.

10. The display apparatus of claim 1, wherein the flexible circuit board is provided as a plurality of flexible circuit boards, and
the plurality of flexible circuit boards is arranged along the first direction on the display panel.

11. A display apparatus comprising:
a flexible circuit board comprising a driving chip and flexible pads arranged in a first direction and extending in a second direction crossing the first direction;
a main circuit board comprising main pads connected to the corresponding flexible pads, wherein the main pads and the flexible pads overlap in a third direction that is perpendicular to both the first direction and the second direction; and
a display panel comprising a plurality of pixels which are connected to the flexible circuit board and configured to receive a signal from the driving chip,
wherein each of the flexible pads comprises a first central portion and a first tilted portion that is tilted from the first central portion, and an angle at which the first tilted portion is tilted from the first central portion is defined as a first angle,
each of the main pads comprises a second central portion which overlaps the first central portion of a corresponding flexible pad, and further comprises a second tilted portion which overlaps the first tilted portion of a corresponding flexible pad, and an angle at which the second tilted portion is tilted from the second central portion is defined as a second angle, and
a difference between the first angle and the second angle of the overlapping pads among the flexible pads and the main pads gradually increases from a main pad and a flexible pad disposed at a center to a main pad and a flexible pad disposed at an outer side.

12. The display apparatus of claim 11, wherein the first tilted portion of a flexible pad comprises a first outer tilted portion and a first inner tilted portion, which are spaced apart from each other in the second direction with the first central portion therebetween and are tilted from the first central portion at the same angle, and
wherein the second tilted portion of a main pad comprises a second outer tilted portion and a second inner tilted portion, which are spaced apart from each other in the second direction with the second central portion therebetween and are tilted from the second central portion at the same angle, wherein the second outer tilted portion of the main pad overlaps the first inner tilted portion of the corresponding flexible pad, and the second inner tilted portion of the main pad overlaps the first outer tilted portion of the corresponding flexible pad in the third direction.

13. The display apparatus of claim 12, wherein the second inner tilted portion of each of the main pads protrudes from the first outer tilted portion that is in contact with the second inner tilted portion, and is exposed to the outside of the flexible circuit board.

14. The display apparatus of claim 13, wherein a length of the second inner tilted portion that protrudes in the second direction is less than half of a length of the second central portion in the second direction.

15. The display apparatus of claim 12, wherein a length of the first inner tilted portion in the second direction and a length of the second outer tilted portion in the second direction are the same.

16. The display apparatus of claim 12, wherein a length of the first central portion and a length of the second central portion are the same.

17. The display apparatus of claim 11, wherein the first tilted portion is tilted from the first central portion in an outward direction toward the outside of the flexible circuit board, and
the second tilted portion is tilted from the second central portion in an outward direction toward the outside of the main circuit board.

18. The display apparatus of claim 11, wherein the first tilted portion is tilted from the first central portion in an inward direction toward the inside of the flexible circuit board, and the second tilted portion is tilted from the second central portion in an inward direction toward the inside of the main circuit board.

19. The display apparatus of claim 11, wherein each main pad of the main pads has an area greater than the area of the corresponding flexible pad it is contact with.

20. The display apparatus of claim 11, wherein the flexible circuit board is provided as a plurality of flexible circuit boards, and the plurality of flexible circuit boards is arranged along the first direction on the display panel.

\* \* \* \* \*